(12) United States Patent
Yang et al.

(10) Patent No.: US 11,107,947 B2
(45) Date of Patent: Aug. 31, 2021

(54) MICRO LIGHT EMITTING DIODE

(71) Applicants: Long Yang, Union City, CA (US); Chao-Kun Lin, San Jose, CA (US)

(72) Inventors: Long Yang, Union City, CA (US); Chao-Kun Lin, San Jose, CA (US)

(73) Assignee: Long Yang, Union City, CA (US)

( * ) Notice: Subject to any disclaimer, the term of this patent is extended or adjusted under 35 U.S.C. 154(b) by 0 days.

(21) Appl. No.: 16/447,050

(22) Filed: Jun. 20, 2019

(65) Prior Publication Data
US 2020/0020825 A1 Jan. 16, 2020

Related U.S. Application Data

(60) Provisional application No. 62/695,962, filed on Jul. 10, 2018.

(51) Int. Cl.
| | | |
|---|---|---|
| H01L 33/00 | (2010.01) | |
| H01L 25/075 | (2006.01) | |
| H01L 33/12 | (2010.01) | |
| H01L 33/16 | (2010.01) | |
| H01L 33/30 | (2010.01) | |
| H01L 33/32 | (2010.01) | |
| H01L 33/40 | (2010.01) | |
| H01L 33/62 | (2010.01) | |
| H01L 33/44 | (2010.01) | |

(Continued)

(52) U.S. Cl.
CPC ...... *H01L 33/0093* (2020.05); *H01L 25/0753* (2013.01); *H01L 33/12* (2013.01); *H01L 33/16* (2013.01); *H01L 33/30* (2013.01); *H01L 33/32* (2013.01); *H01L 33/405* (2013.01); *H01L 33/62* (2013.01); *H01L 22/14* (2013.01); *H01L 33/007* (2013.01); *H01L 33/06* (2013.01); *H01L 33/44* (2013.01); *H01L 2933/0016* (2013.01); *H01L 2933/0025* (2013.01); *H01L 2933/0066* (2013.01)

(58) Field of Classification Search
CPC . H01L 21/6835; H01L 24/95; H01L 25/0753; H01L 33/0093; H01L 2224/83; H01L 2224/94; H01L 2224/95001; H01L 2224/97; H01L 2924/1461; H01L 2933/0016; H01L 2933/0025; H01L 2933/0033; H01L 2933/0066
See application file for complete search history.

(56) References Cited

U.S. PATENT DOCUMENTS

| | | | | |
|---|---|---|---|---|
| 2014/0340900 | A1* | 11/2014 | Bathurst | B81C 99/002 362/249.02 |
| 2017/0278733 | A1* | 9/2017 | Chang | H01L 33/0095 |
| 2019/0147778 | A1* | 5/2019 | Xia | B41C 1/06 257/88 |

* cited by examiner

*Primary Examiner* — David C Spalla
(74) *Attorney, Agent, or Firm* — Shalini Venkatesh

(57) ABSTRACT

Embodiments generally relate to micro-device arrays. In some embodiments, an array comprises a substrate and a plurality of micro-devices. Each micro-device is suspended over a cavity in the substrate by at least one lateral hinge attached to a side post formed into the substrate. Each micro-device comprises a bonding layer; a metal contact; semiconductor device layers; and a buffer layer. The semiconductor device layers may comprise GaN-based LED layers; wherein the buffer layer comprises AlGaN; and wherein the substrate comprises (111) oriented Silicon. In other cases, the semiconductor device layers may comprise InGaAsP-based LED layers; wherein the buffer layer comprises InGaP; and wherein the substrate comprises GaAs.

14 Claims, 45 Drawing Sheets

(51) Int. Cl.
*H01L 21/66* (2006.01)
*H01L 33/06* (2010.01)

MICRO LIGHT EMITTING DIODE

CROSS REFERENCES TO RELATED APPLICATIONS

This application claims priority from U.S. Provisional Patent Application Ser. No. 62/695,962, filed on Jul. 10, 2018, which is hereby incorporated by reference as if set forth in full in this application for all purposes.

FIELD OF INVENTION

This invention relates in general to the field of microdevices, such as micro-LEDs, including arrays of such devices and methods of fabrication thereof.

BACKGROUND

Micro-LEDs (u-LEDs) are very small LEDs, in the range 1 um to 300 um, fabricated from epitaxially grown wafers. Typically, the materials needed for generating lights require dedicated equipment such as MOCVD or MBE. The materials are GaN, AlGaN, InGaN, GaAs, AlGaAs, InGaP, InGaAsP, etc. The substrates are typically Silicon, SiC, Sapphire, GaN, AlN, GaAs, InP, etc. After epitaxial growth, the wafers are processed using semiconductor fabrication process similar to, but not limited to, the CMOS processes. Using a series of lithographic processes, depositions and etching processes, LED devices are formed to facilitate efficient current injection into the active gain region to generate lights and efficient optical extraction of light from semiconductors. The fabrication techniques for making LED are well known art in the field. Typically, after the wafer process, the LED wafers are separated by dicing or breaking process into individual chips. The individual chips are assembled into other carriers designed for various applications.

In many applications such as displays, two dimensional arrays of LEDs are needed to be assembled. Often, the distances between LEDs are much larger than the size of the LEDs. For example, the size of a large display can be as large as 10-meter wide and the number of LEDs can be greater than 10 million. It would be too costly to use LEDs with conventional sizes in the order of 1 mm. For example, for typical high-resolution (HD) LED displays (1920×1080), there are ~2 millions LEDs for each color. If each LED costs $0.05 (the material cost of 1 mm×1 mm LEDs), the cost of all LEDs for this HD display would be prohibitively $300,000, not including other costs. To reduce the cost of LEDs, the most effective way is to reduce its size. In order to make such high-definition LED displays into the affordable range, say $1,000, the cost of each LED must be reduced by 300 times or its area must be reduced by 300 times. This means the size of LED should be in the range of 50 um×50 um. Further cost reduction will require even smaller LEDs.

The challenge of making 50 um×50 um LEDs is not the lithography itself, but how to transfer the devices after lithography, from the native substrate in or on which they are fabricated to the destination display board (or other circuit or substrate), or more specifically:

(1) How to pick up such small parts, if necessary distinguishing between selected parts and leaving unselected parts in their original positions
(2) How to perform the pick-up economically and efficiently
(3) How to position them into a precise array (if desired) at the destined location Some current approaches use bonding metal to release micro-LEDs to be picked up by the pickup head via electrostatic force. In some cases, a compliance transfer head allows the pickup head to accommodate the non-ideal situation during the pickup. In other cases, post structures are built onto the bonding metal to reduce the surface area. In one case, micro-LEDs are released by physical breakage of shear release posts.

Major challenges of all these constructions lie in the release of selected LEDs to the pickup heads while keeping remaining LEDs in original position. Clearly, releasing by melting bonding material is not ideal. The release by physical breakage using shear force can be really problematic because such breakage is not well controlled.

Above 300 um, conventional methods of handling of LEDs can work reasonably well. For example, if the LEDs are made on a Sapphire substrate, breaking the substrate works for dimensions greater than 300 um but is problematic below that. Typically, LED substrates are thinned down to ~100 um before cleaving or dicing. It is clear that when the edges of LEDs are less than 100 um in length, the LEDs are not even stable enough to place on a surface without supports. When the chip size becomes even smaller, the substrate has to be thinned further. The weight of each LED chip becomes so small that any small effect can be influential, for example Van der Waals force, internal stress between dissimilar materials, etc.

As noted above, some currently known approaches use bonding metal to release some micro-LEDs to be picked up by the pickup head via electrostatic force and the same bonding material is used to affix the released micro-LEDs onto the receiving substrate. In this process, the electrostatic force is competing against the surface tension of the melted bonding material. It has been recognized that the etching of bonding metal, typically done to remove metal between devices, could be very problematic because an uncontrollable amount of metal can be sputtered to the size wall of the device, causing shorting. It has also been recognized that the amount of electrostatic force depends on the contact area between the pickup head and the micro-LED. This may be addressed by using a compliance transfer head to allow the pickup head to accommodate non-ideal aspects of the situation, for example, warpage of substrates, non-parallelism between substrates, or even the presence of large particles dropped onto the surface. But, even with the compliant pickup heads, the release of micro-LED is still an issue.

Also as noted above, some current approaches build post structures onto the bonding metal to reduce the surface area. But, clearly, this process is quite delicate because the bonding metal, once melted, can move and enlarge its contact area with micro-LEDs. one other approach is to create a micro-LED structure which affix to a side wall in a selected area through undercut etch of sacrificial layer. These undercut micro-LED are released by physical breakage of attachments. The fabrication of shear release posts is very delicate, and the amount of force needed for breakage is not well controlled.

There is, therefore, a need for methods for precise and reliable transfer (pick up and release) of very small parts from the substrate on which they are formed to destination boards or substrates, and for designs for arrays of such parts that allow those methods to operate. Ideally such methods and designs would be compatible with and incorporated into conventional semiconductor manufacturing processes, making the whole operation very cost-effective.

SUMMARY

Embodiments generally relate to arrays of micro-devices designed and fabricated to facilitate handling, transfer between substrates, and test.

In some embodiments, an array comprises a substrate and a plurality of micro-devices, wherein each micro-device is suspended over a cavity in the substrate by at least one hinge attached to a side post formed into the substrate. Each micro-device comprises a bonding layer; a metal contact; semiconductor device layers; and a buffer layer.

In one of those embodiments, the active semiconductor layers comprise GaN-based LED layers; the buffer layer comprises AlGaN; and the substrate comprises (111) oriented Silicon. In another of those embodiments, the active semiconductor layers comprise InGaAsP-based LED layers; the buffer layer comprises InGaP; and the substrate comprises GaAs.

DETAILED DESCRIPTION

In some embodiments of this invention, a new microdevice structure, more specifically a micro-LED structure, is disclosed to overcome the handling problems discussed above, encountered in the prior arts. The application of the inventive ideas disclosed herein is not limited to micro-LEDs, although micro-LEDs are used as an example. Those familiar in the art will understand how to apply the principles to other kind of micro-devices, such as lasers, micro-sensors, small integrated circuit, or MEMS devices.

To make inorganic light-emitting diodes, typically, the materials are semiconductor crystals formed epitaxially on crystal substrates. For blue and green LEDs, the most popular substrates are Sapphire and SiC. For red LEDs, the most popular substrate is GaAs. However, in the present invention, the substrate for blue and green LEDs is chosen to be wet-etchable substrate such as Silicon. Although SiC can be wet etched, it requires very high temperature which is not compatible with semiconductor process. KOH can etch Silicon much faster than GaN.

On the other hand, growing GaN-based material on (111) oriented Silicon has been demonstrated with high quality. This is because (111) Si exhibits a 3-fold symmetry needed for as a template for hexagonal crystal structure of GaN.

Figure 1:
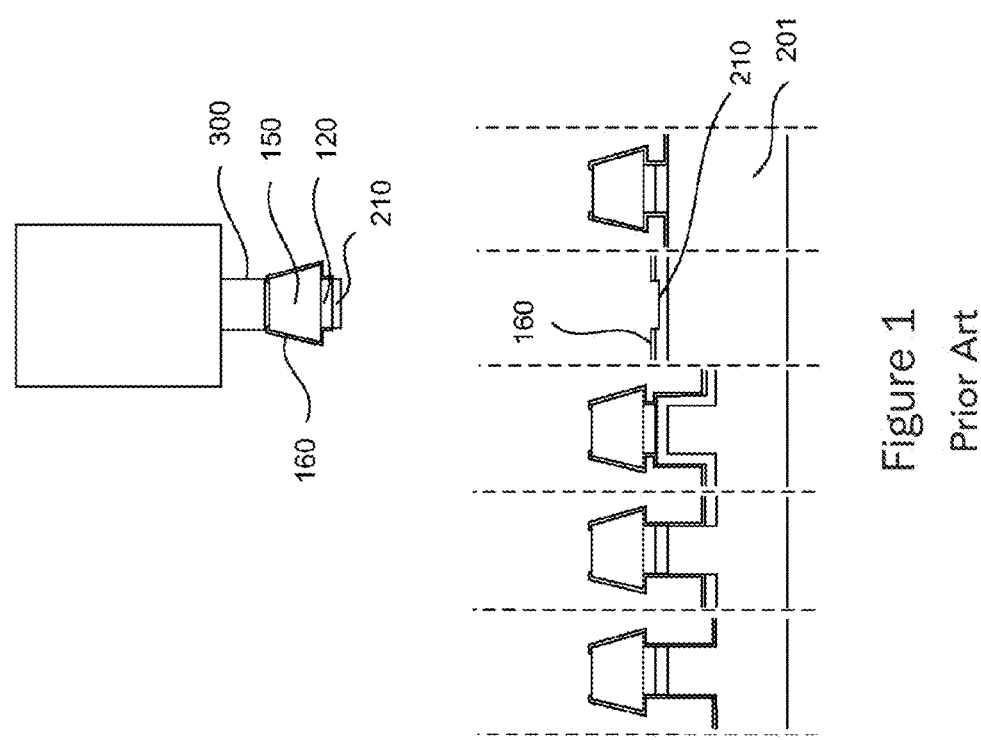
FIG. 1 (Prior art) Releasing micro-LED by re-melting bonding metal
Figure 2:
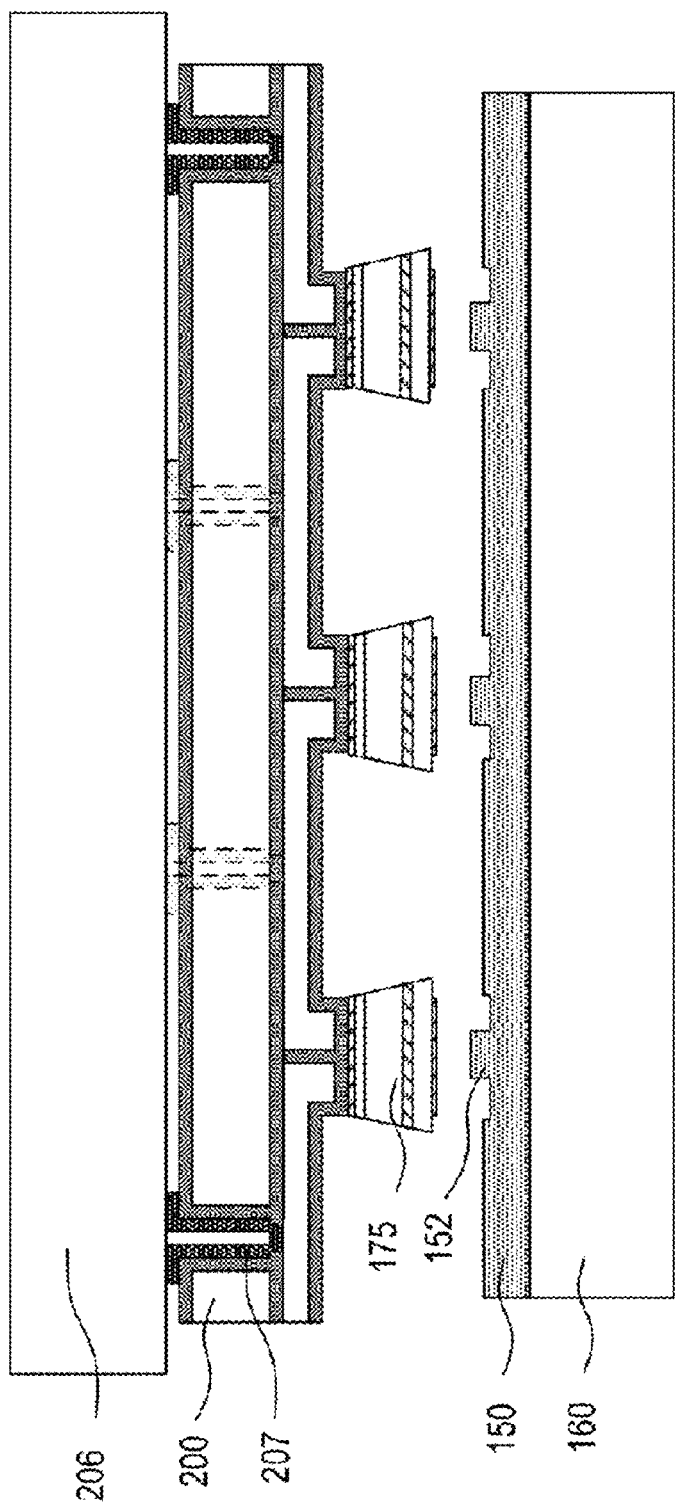
FIG. 2 (Prior art) Compliant Array of pickup heads
Figure 3:
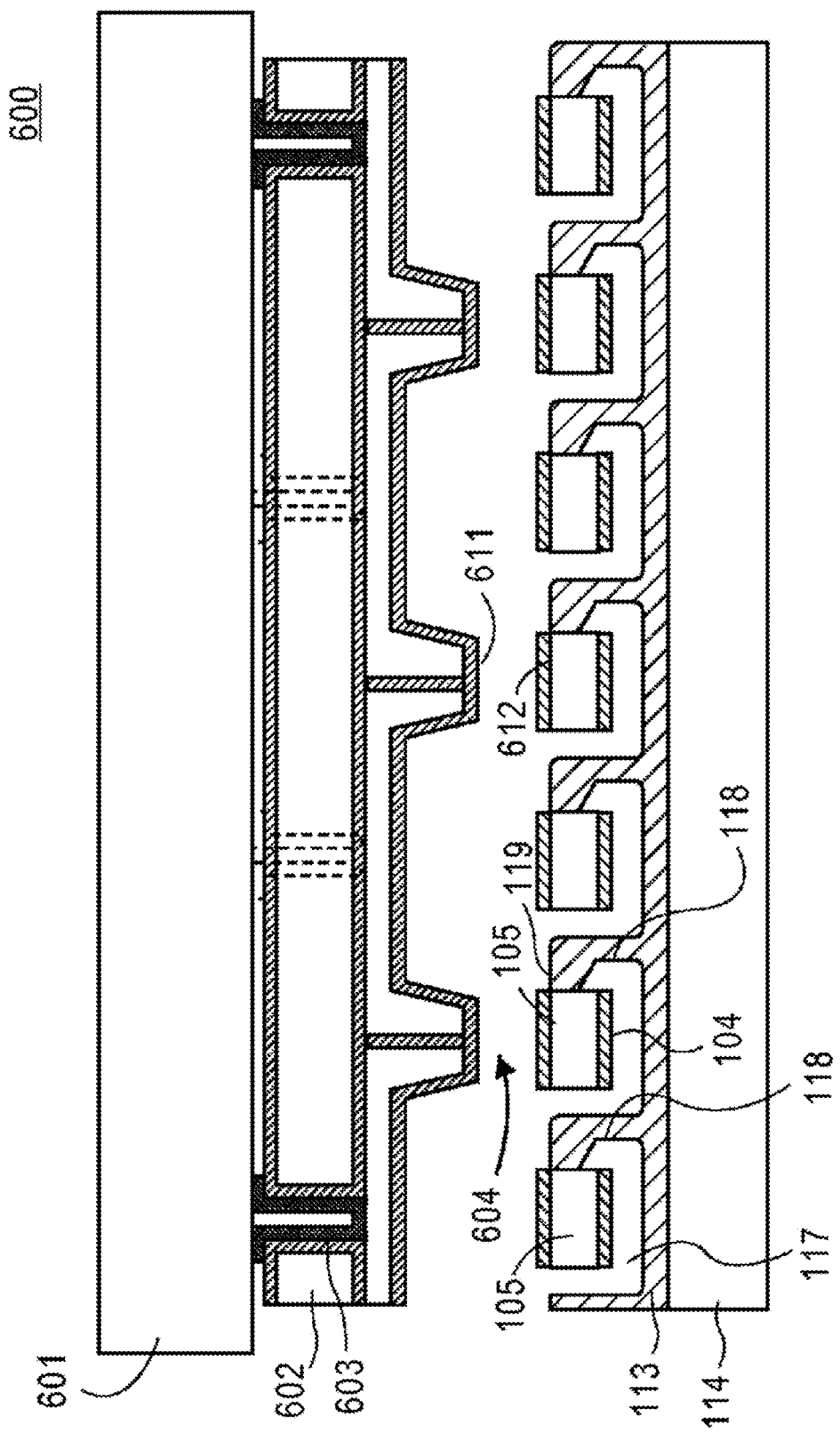
FIG. 3 (Prior art) Release micro-LED by sheer force

Some approaches to microdevice fabrication and handling, prior to the present invention, involve the use of bonding metal to release some micro-LEDs to be picked up by the pickup head via electrostatic force. FIG. 1 illustrates such an approach. FIG. 2 illustrates another prior art approach, where a compliant transfer head allows the pickup head to accommodate non-ideal substrate flatness during device pickup. In some cases, post structures are built onto the bonding metal to reduce the surface area. FIG. 3 shows one such case where u-LEDs are released by physical breakage of shear release posts.

FIGS. 4A through 4D illustrate the formation of micro-LEDs according to some embodiments of the present invention.

Figure 4A:
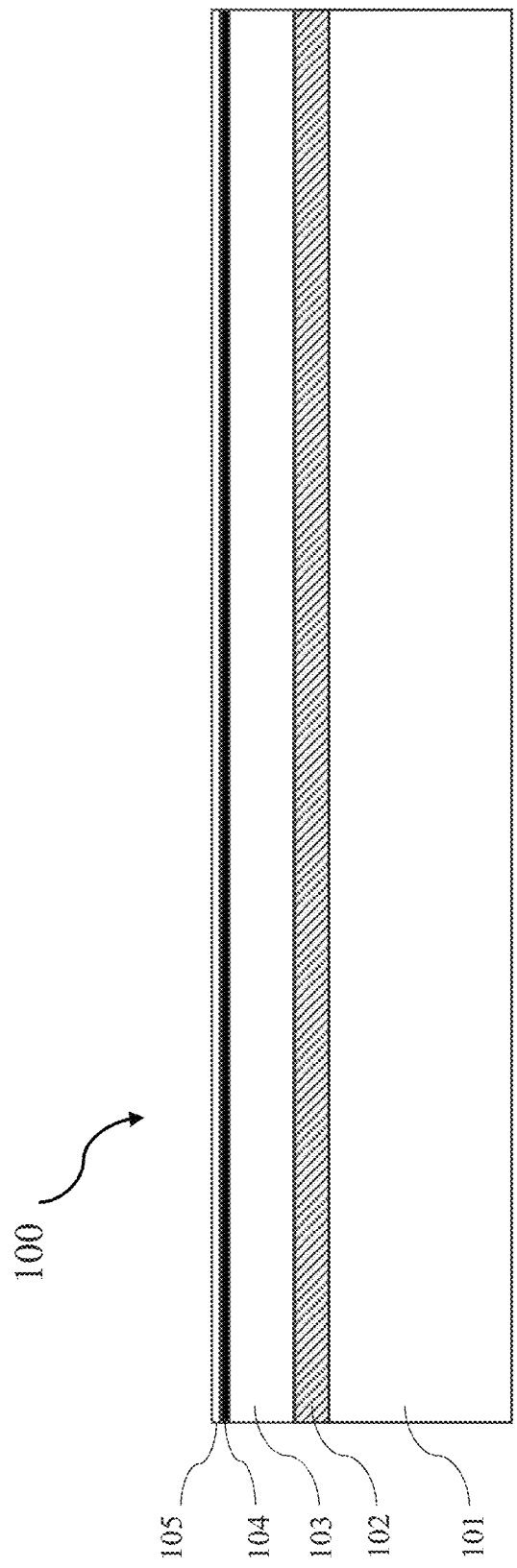
FIG. 4A is a cross section view through a substrate after the first step of a process to create an LED array according to one embodiment.

FIG. 4A illustrates the first step of a process carried out on the top surface of a silicon substrate (on which GaN-based LEDs are to be formed) according to one embodiment of the present invention. A buffer layer 102 is grown on top of 111-oriented Silicon substrate 101, to greatly reduce the incidence of dislocations resulting from lattice mismatch between Si and Ga. The buffer layer 102 typically initiates with an AlN layer, to seal the silicon surface to avoid any exposure of Si to Ga. This is because Ga and Si could otherwise form an alloy, which would enter a liquid phase at typical epitaxial growth temperatures, such as above 800 C.

After buffer layer 102 is grown, n-layer 103, which may include n-doped GaN or InGaN or AlGaN, is deposited, acting as a supply of electrons. Layer 103 may itself be made up of sub-layers. Next, light emitting layer 104, typically a multiple quantum well structure (MQW), is grown. Finally, p-layer 105, made up of p-doped GaN or AlGaN is deposited on top of MQW 104, acting as a supply layer of holes. When an external bias voltage is applied, the electrons and holes supplied by 103 and 105 will flow into the MQW region 104, where they combine to generate photons with the energy close to the bandgap of the MQW structure.

In other embodiments, in which red LEDs are fabricated, a layered structure like that shown in FIG. 4A is grown, but with different materials for some of the layers. In these cases, substrate 101 is typically GaAs. While it is not essential, InGaP layer 102 is typically grown on this substrate to act as an etch stop. For example, HCl: 10 $H_3PO_4$: 1 $H_2O_2$ can etch GaAs 100 times faster than InGaP. After InGaP etch stop layer 102, a n-AlGaAs electron supply layer 103 is deposited, followed by the light generating layer 104 which can be AlInGaP or other appropriate material. The hole supply layer 105 such as p-AlGaAs is deposited on top of light generating layer 104.

These layer structures are for illustration purposes. There are many other materials which can be used to form blue, green and red LEDs.

Figure 4B:
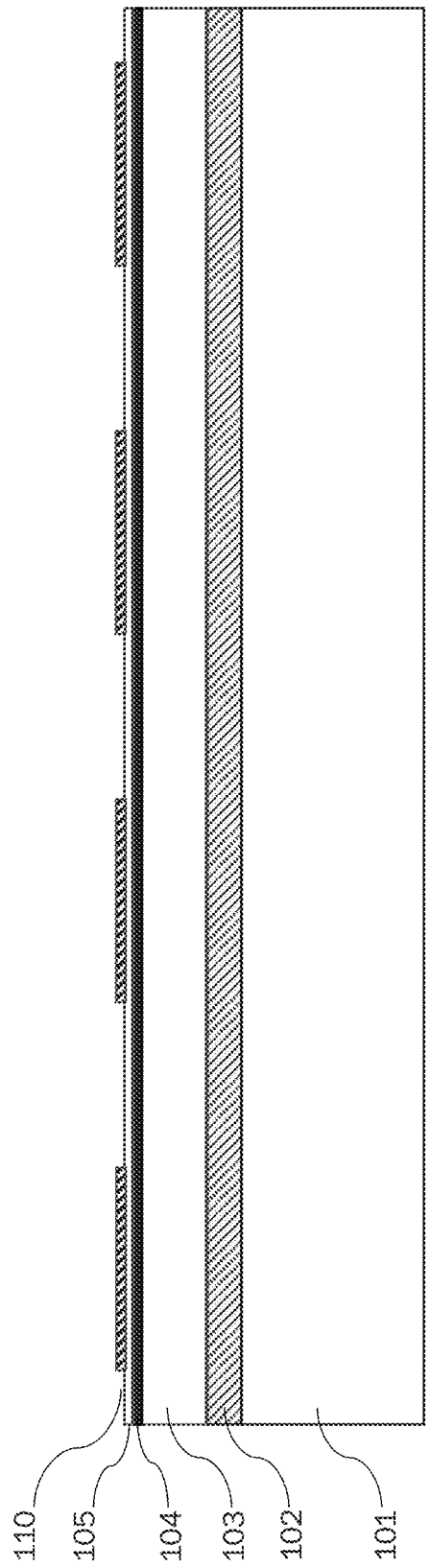
FIG. 4B is a cross section view after the second step of the process for the embodiment of FIG. 4A.

After the LED materials are deposited by either MOCVD or other epitaxial techniques to produce a structure as shown in FIG. 4A, the substrate wafers are processed using typical semiconductor processes. As FIG. 4B shows, p-metal contact 110 is selectively deposited on p-layer 105, either by etching after uniform deposition or by a lift-off technique. Contact 110 is typically a p-metal stack, including many layers in order to achieve good electrical contact to the hole supply layer 105, provide high reflectivity[1] to the light generated from the light-generating layer 104, and act as a barrier material to prevent metal mixing with bonding layer 116 which will be deposited near the final step of the fabrication process (see FIG. 6E discussed below).

[1] An optical reflectivity of approximately 70% or greater is typically adequate. Reflectivities of 90% or greater may be preferable in some applications.

Figure 4C:
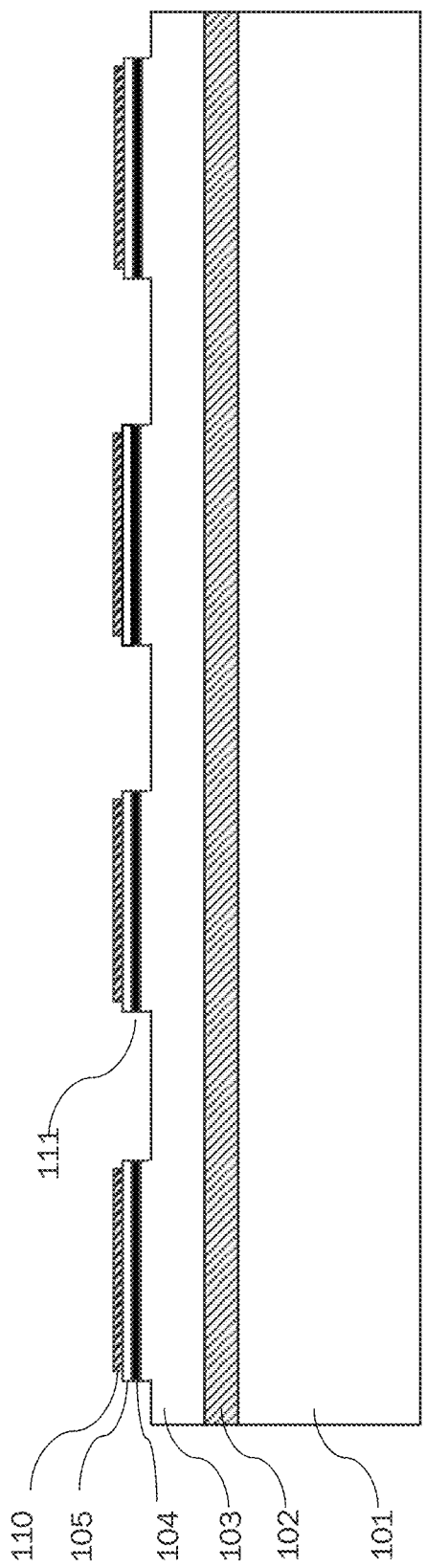
FIG. 4C is a cross section view after the third step of the process for the embodiment of FIGS. 4A and 4B.
Figure 4D:
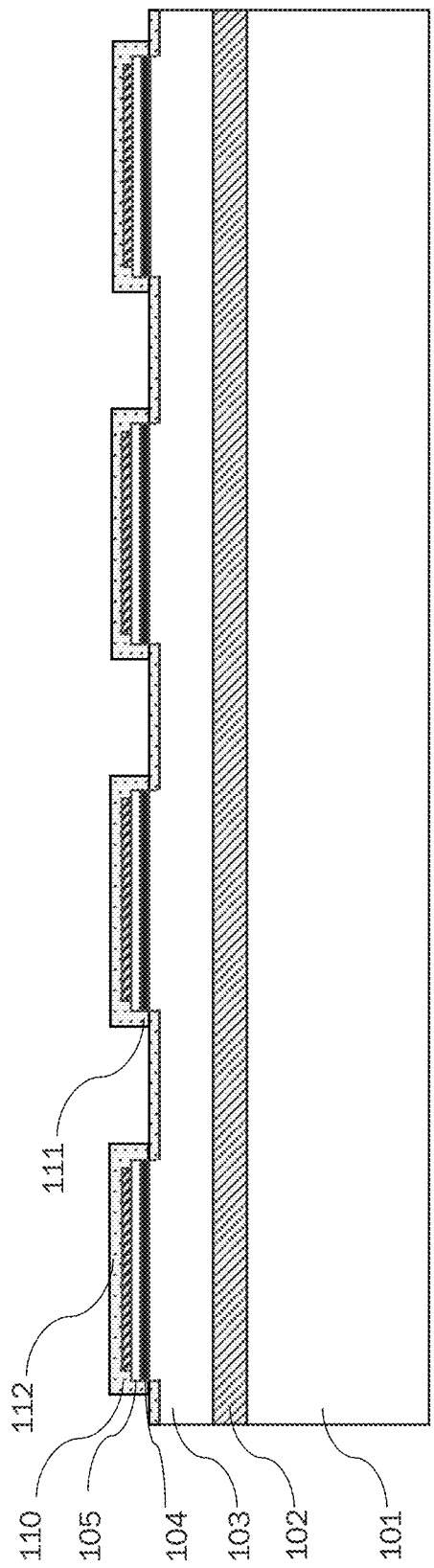
FIG. 4D is a cross section view after the fourth step of the process for the embodiment of FIGS. 4A, 4B and 4C.

As shown in FIG. 4C, After the deposition of the p-metal stack, a confinement mesa etch is performed to selectively remove p-GaN 105, MQW 104 and some n-GaN 104, as shown in FIG. 4C, exposing the p-n junctions along mesa edge 111 of the micro-LEDs thus formed. Next, as shown in FIG. 4D, a thin dielectric layer 112, comprising a material such as $SiO_2$ or SiN etc, is conformally deposited to protect the p-n junction on mesa 111 from exposure to subsequent processing steps. This will prevent unwanted leakage current from flowing through the etched p-n junction through surface contamination. After this point, the device area is electrically defined and the rest of the processing steps are carried out simply to form the mechanical features into the micro-LEDs so that they can be picked up individually or in small groups as desired, and transferred efficiently from the substrate on which they are formed to subsequent substrates or circuit boards.

Figure 5A:
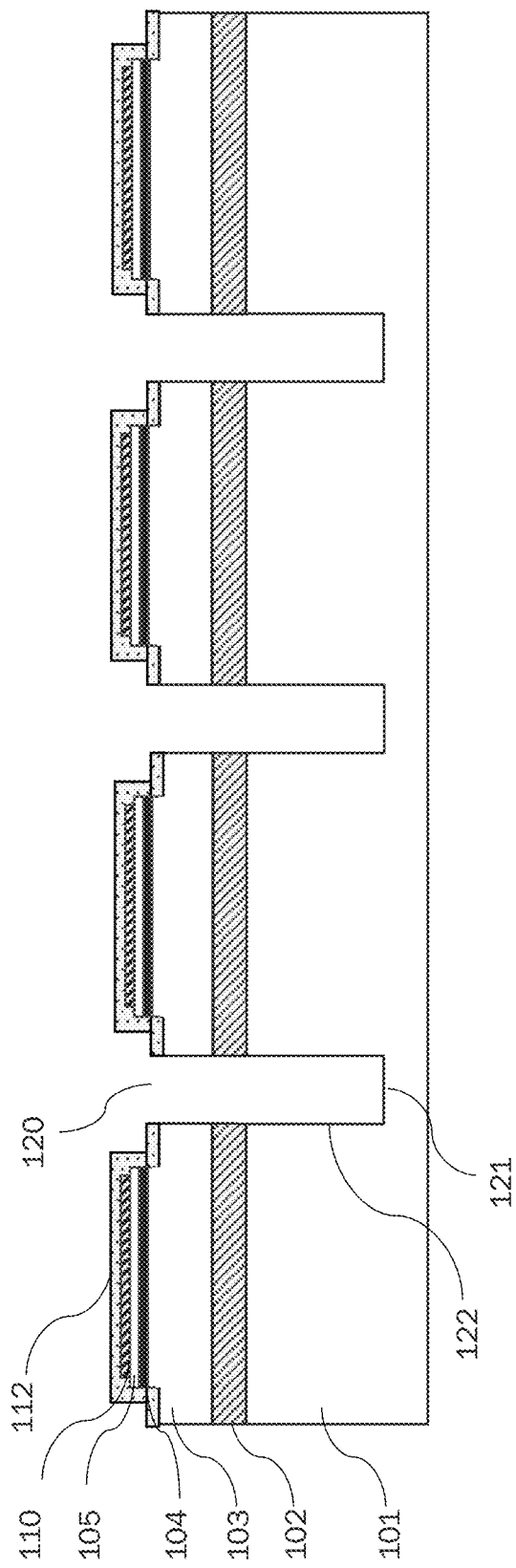
FIG. 5A is a cross section view through a substrate after the first step of a process to make posts for an array according to one embodiment.
Figure 5B:
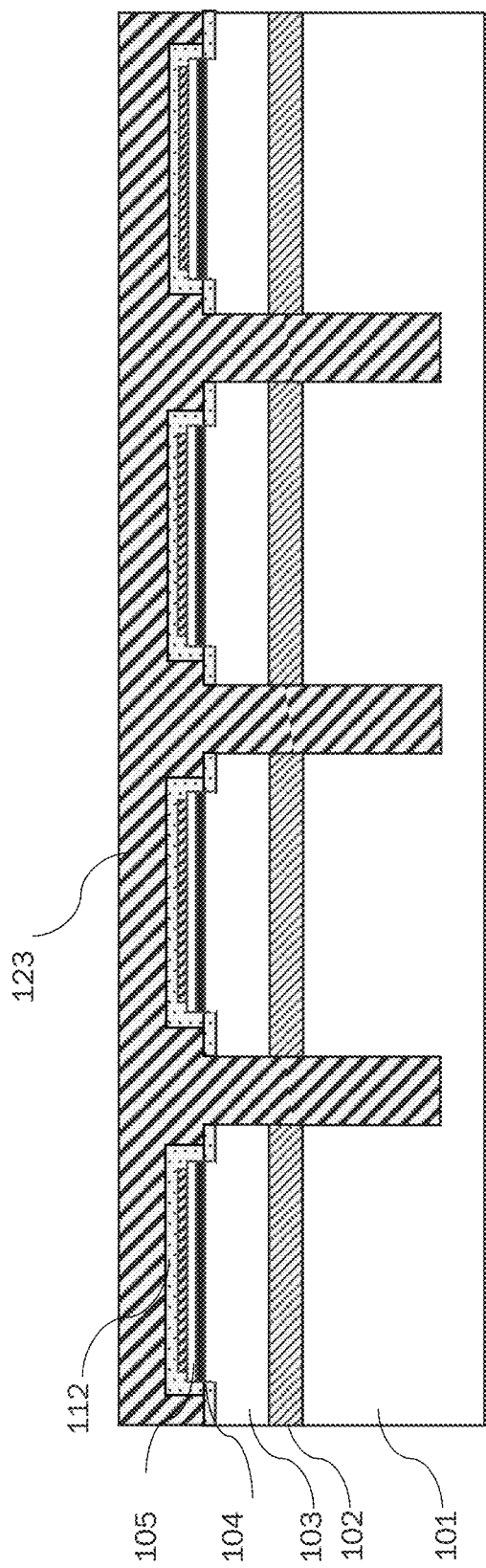
FIG. 5B is a cross section view after the second step of the process for the embodiment of FIG. 5A.
Figure 5C:
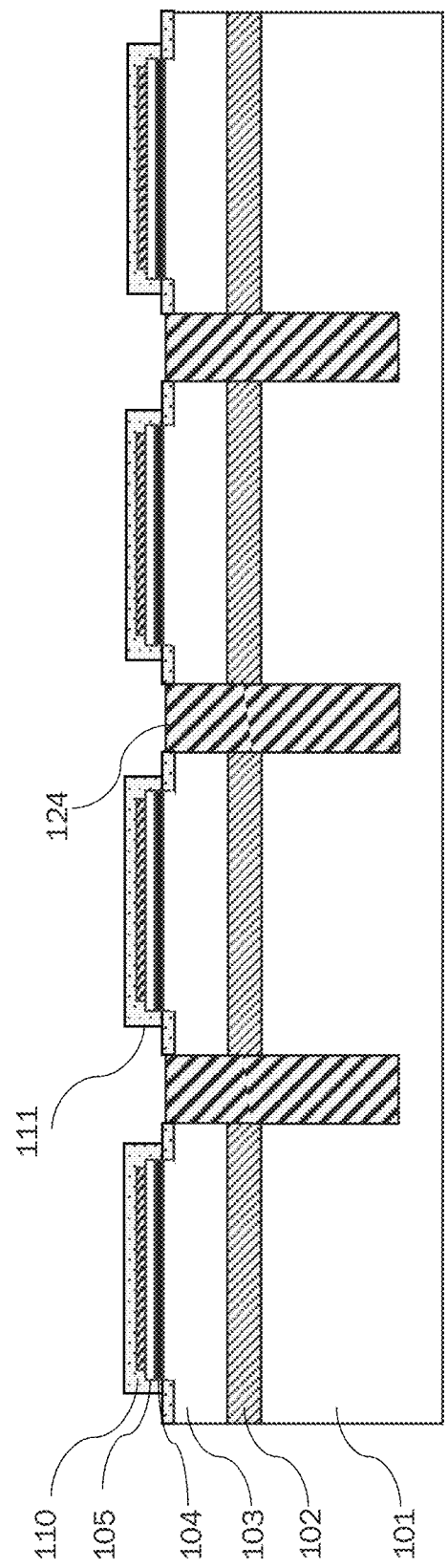
FIG. 5C is a cross section view after the third step of the process for the embodiment of FIGS. 5A and 5B.

FIGS. 5A through 5C illustrate the formation of posts between micro-LEDs (already created using the process of FIGS. 4A through 4D) according to one embodiment of the present invention.

FIG. 5A shows the result of applying a standard dry etch technique such as RIE or CIBE to anisotropically etch deep trenches 120 through epitaxially grown layers 102, 103 and into the substrate 101. The trench depth 122 in substrate 101 may range from 1 um to 20 um. The trench (or via) width 121 may range from 1 um to 20 um. The precise side wall profile is not very important, but, in order not to waste device areas, it is preferred that the side wall be close to vertical, for example within 20 degrees of the vertical.

FIG. 5B shows the substrate wafer after the next step of the post formation process, when post material 123 has been deposited and a planar top surface created. There are many way to accomplish this, depending in part on whether the material is inorganic (metallic or non-metallic) or organic. For example, if using metal as the post material, one can blanket-deposit a thin metal and then use metal plating to fill trenches 120. The plating process is usually conformal. Optionally, a polishing step can be used to planarize the surface. Many metals, such as Al, Cu, Ni, etc. are easily plated using commercially available plating solutions. The choice of metals should facilitate the subsequent etching process.

Alternatively, the material forming the posts may include spin-on glass, polyimide or BCB insulating materials, that are spun onto the top surface of the structure. Such spin coatings have to be fully or partially cured to turn the material into solid form before further processing. Typically, the curing process will cause shrinkage of the spin-coating materials. Therefore, care must be taken during the process to avoid delamination within the trenches. The degree of curing should take into consideration of the etch rate of subsequent etching process.

FIG. 5C shows the substrate wafer during the last step of the post formation process. Post material 123 has been etched from the top surface until the material remains only in the trenches. The top surface of each resulting post 124 is set to be close to the surface of the adjacent dielectric protection layer 112. After the etching, if spin-on glass, polyimide or BCB are used, the post material should be cured further to strengthen the materials.

Posts are a very important feature of this invention. The posts need to extend into the substrate by a sufficiently large depth. The adhesion of post material to the substrate should be strong.

FIGS. 6A through 6H illustrate the structural isolation, bonding-preparation, and suspension of micro-LEDs (already created using the process of FIGS. 4A through 5C) according to one embodiment of the present invention.

Figure 6A:
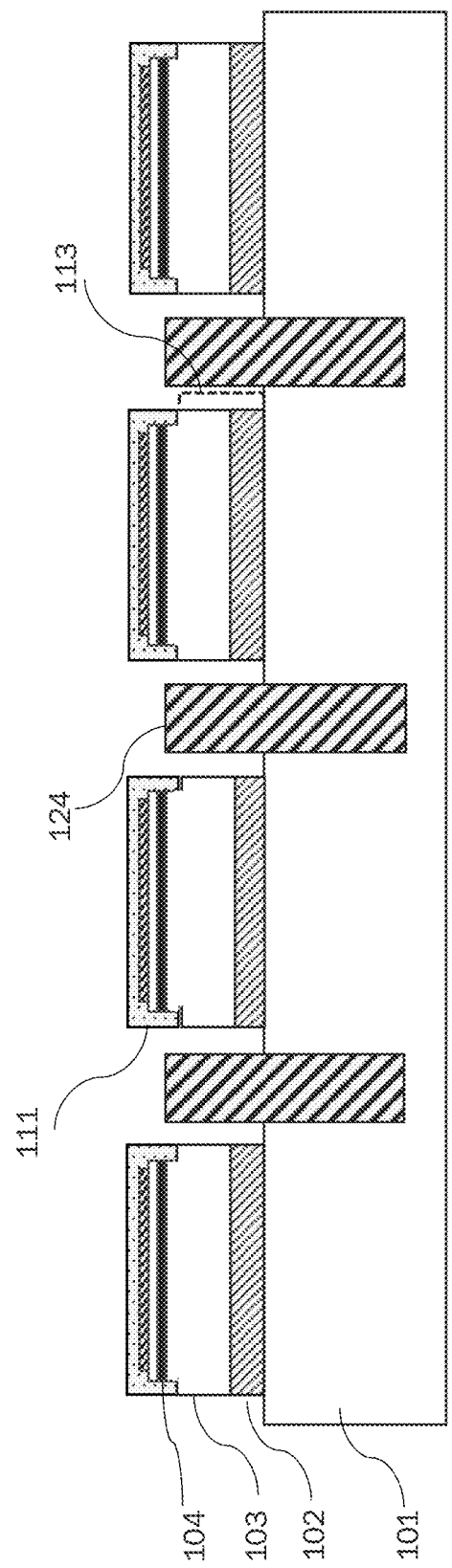
FIG. 6A is a cross section view through a substrate after the first step of a process to isolate micro-LEDs, prepare them for bonding, and suspend them in an array according to one embodiment.
Figure 6B:
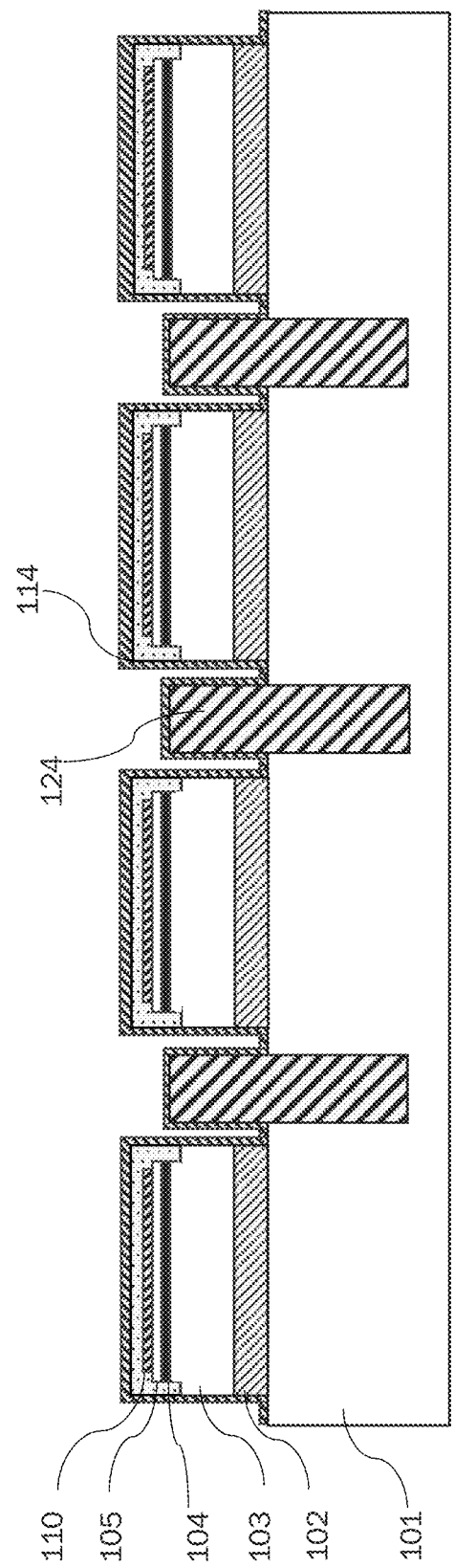
FIG. 6B is a cross section view after the second step of the process for the embodiment of FIG. 6A.

FIG. 6A illustrates a cross section view through part of an array, after the first step of the process of structural isolation has been carried out. This is a device isolation etch, performed to define the areas of the micro-LEDs on top of the substrate, which acts as an etch stop. The etchant is chosen to etch the post material minimally if at all. Although in the embodiment of FIG. 6A a post seems to be present between every pair of adjacent micro-LEDs, this is not necessarily the case. FIG. 6A only depicts one particular cross section through the substrate, where posts happen to be located. In other cross sections, there could be only isolation trenches between adjacent devices.

The isolation etch exposes more side wall areas 113 of n-GaN layer 103 and buffer layer 102. Although these are not sensitive to contamination, there exists a potential issue of etching selectivity which will be described later. Therefore, a device protection layer 114 is isotropically deposited to cover the sidewalls of layers 102, 103, leaving the array structure shown in FIG. 6B. The benefits of this protection layer will be discussed later.

Figure 6C:
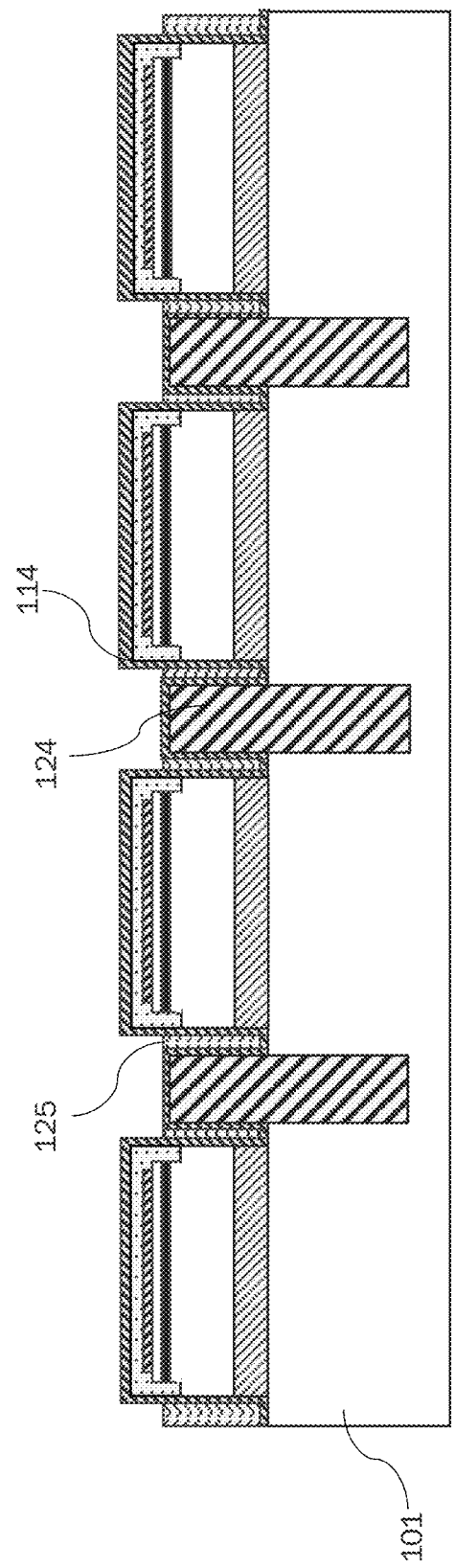
FIG. 6C is a cross section view after the third step of the process for the embodiment of FIGS. 6A and 6B.

After device protection layer 114 is deposited, a dielectric spin-on filler 125 is deposited, to fill the trench spaces around the tops of the posts. FIG. 6C illustrates the array after this deposition. The filler 125 can be just photoresist or a soft cured spin-on glass or BCB. An etch-back process may be used to remove the residual material left on the device surface. Typically, for organic materials such as photoresist and BCB, an Oxygen plasma is used to perform the etch.

Figure 6D:
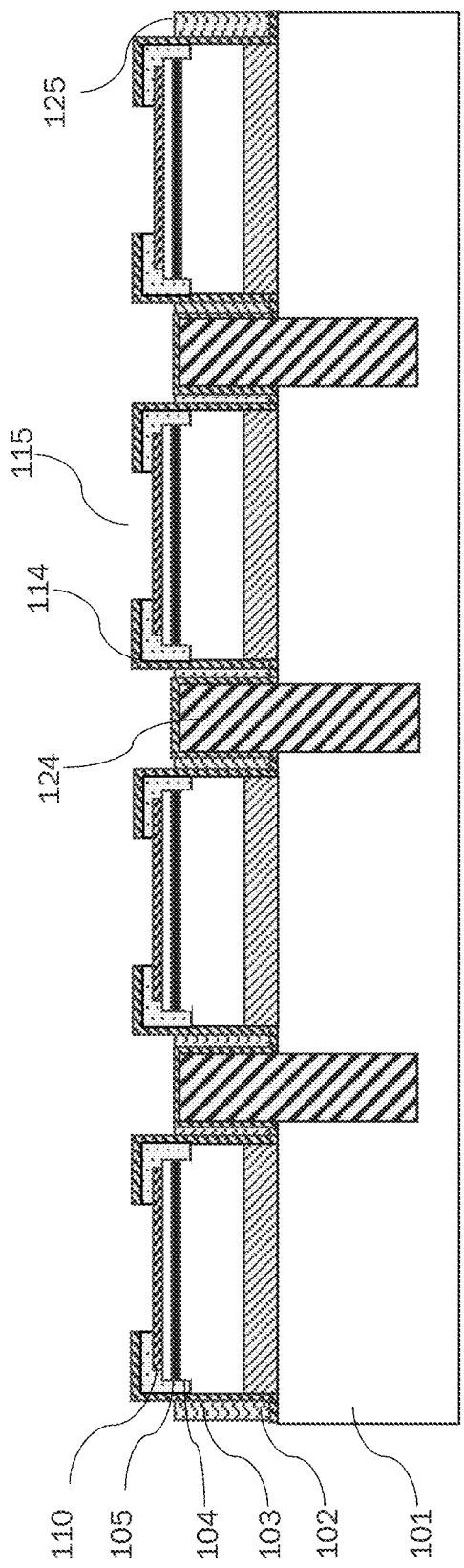
FIG. 6D is a cross section view after the fourth step of the process for the embodiment of FIGS. 6A, 6B and 6C.
Figure 6E:
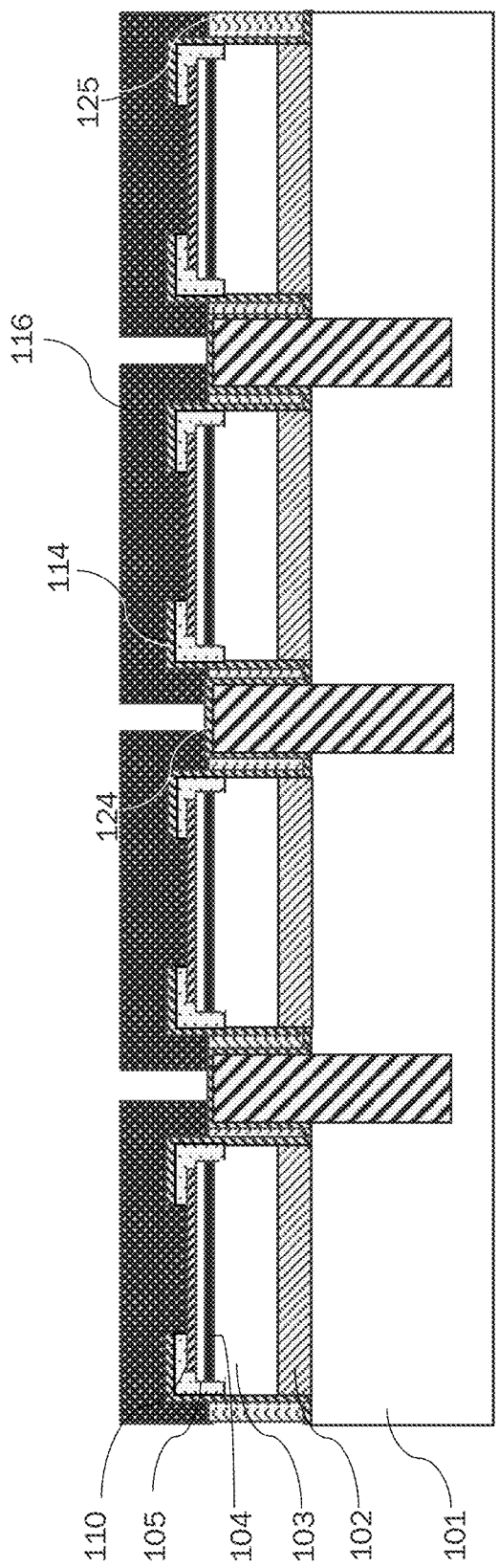
FIG. 6E is a cross section view after the fifth step of the process for the embodiment of FIGS. 6A, 6B, 6C and 6D.

FIG. 6D illustrates the array after the formation of p-contact openings 115, made by selectively etching parts of the dielectric layers 114 on top of p-metal stack 110. The size of each opening 115 is purposely made much smaller than the top surface area of the corresponding p-metal stack 110. Next, as illustrated in FIG. 6E, a bond metal stack layer 116 is selectively deposited over and around the top of each device, on top of dielectric layer 114 and through openings 115 to contacts 110. The selective deposition may involve either a patterned etch process or a patterned photoresist liftoff process. In the embodiment shown in this Figure, in some areas, bonding layer 116 may run across trench filler 125 and extend over part of the top surface of each post 124 to allow hinges to be formed, as described below.

In other embodiments, not shown, the hinges may be formed before bonding layer 116 is deposited, using a different hinge material, and a separate masking step.

Figure 6F:
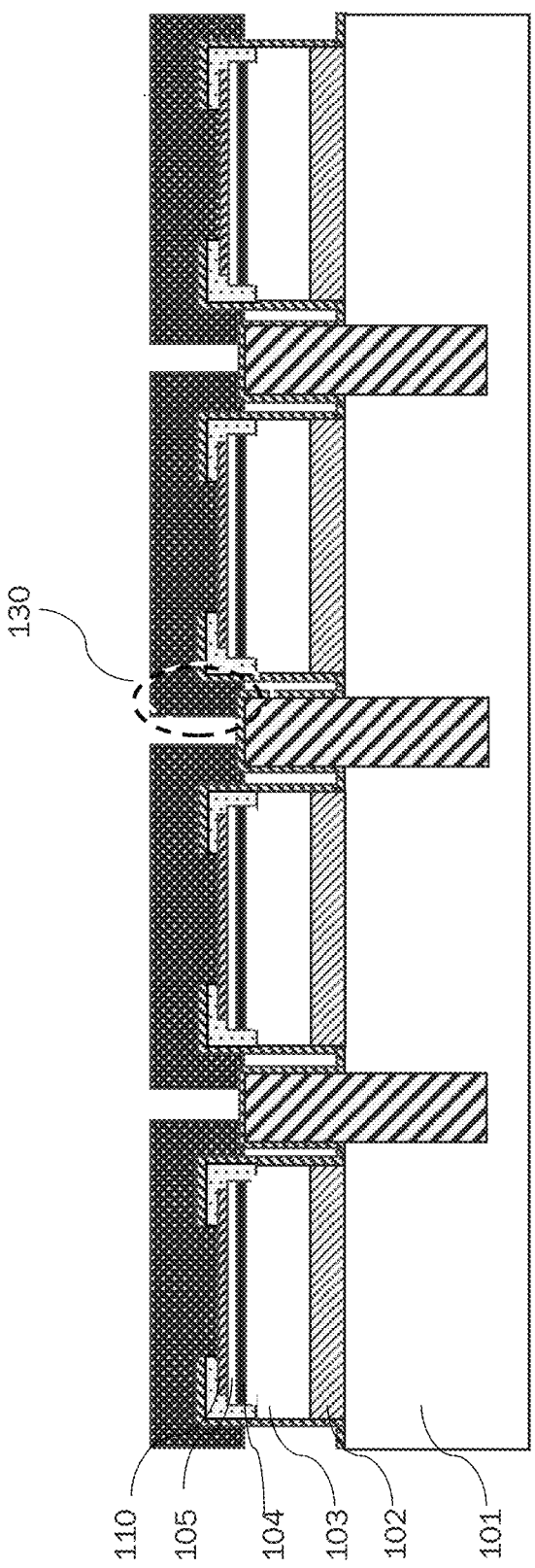
FIG. 6F is a cross section view after the sixth step of the process for the embodiment of FIGS. 6A, 6B, 6C, 6D and 6E.
Figure 6G:
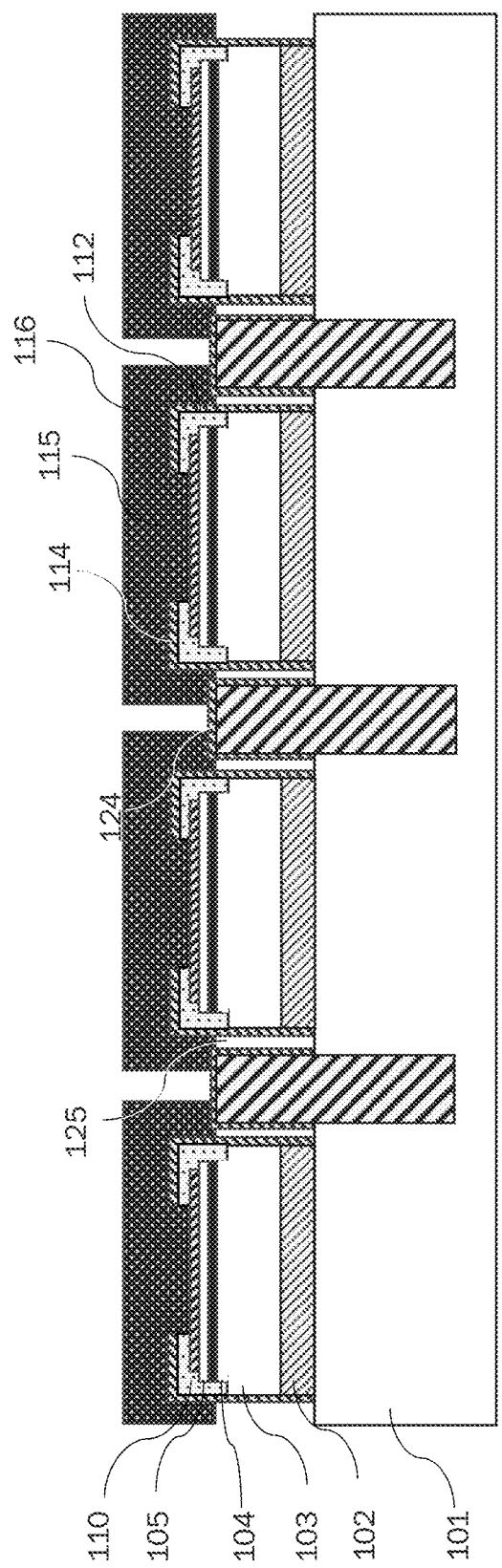
FIG. 6G is a cross section view after the seventh step of the process for the embodiment of FIGS. 6A, 6B, 6C, 6D, 6E and 6F.
Figure 6H:
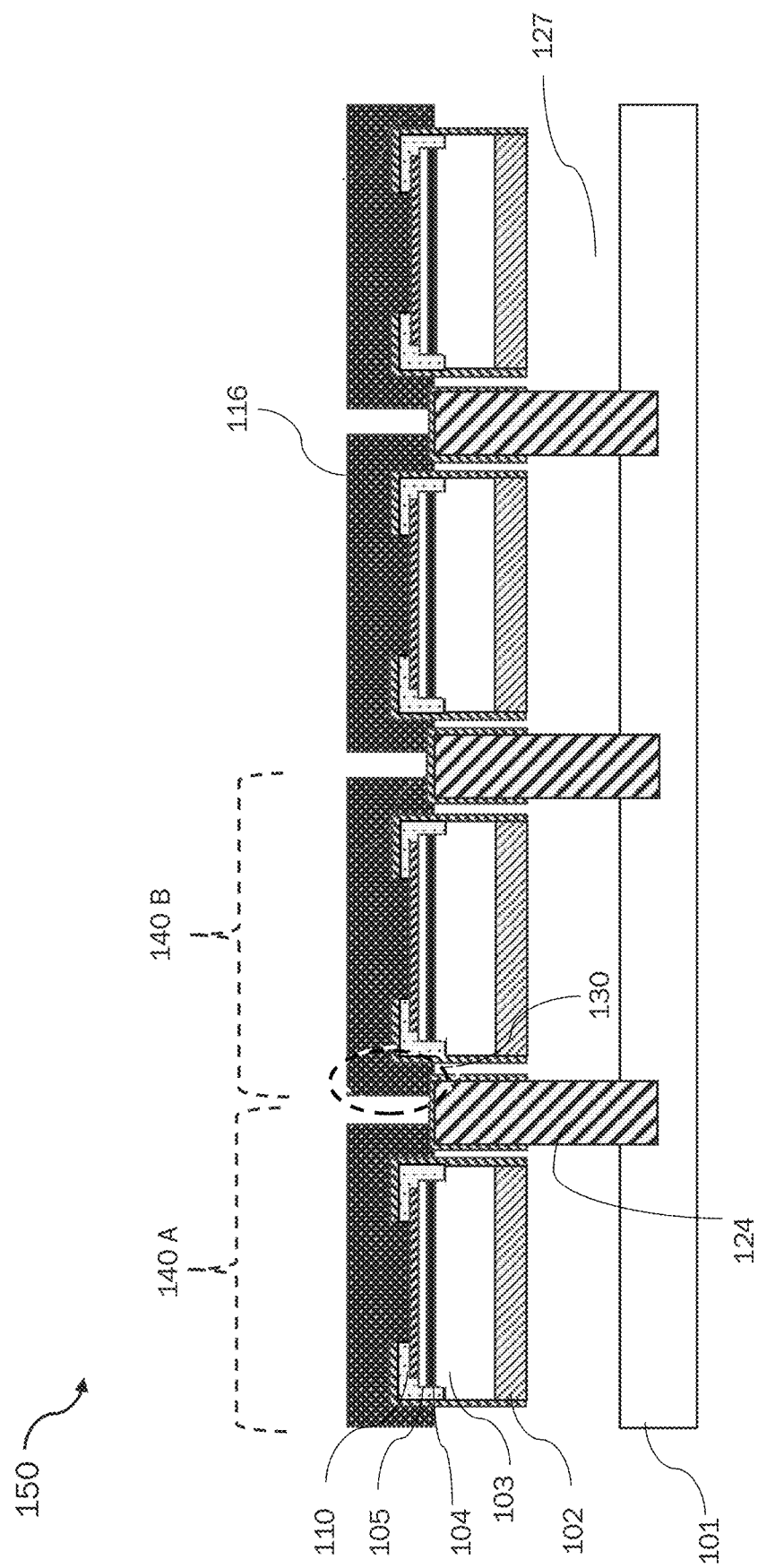
FIG. 6H is a cross section view after the eighth step of the process for the embodiment of FIGS. 6A, 6B, 6C, 6D, 6E, 6F and 6G.

FIG. 6F illustrates the array after the next step of the process, where after the deposition of bonding layer 116, trench filler 125 has been dissolved by a solvent such as acetone. After the removal of trench filler 125, each hinge 130, roughly indicated by the dashed oval outline in the Figure, forms a bridge between the micro-LED and the post. FIG. 6G shows the micro-device array after those parts of the dielectric protection layer 114 which were not covered by bonding layer 116 have been etched away by RIE. This etch exposes the bottom of the trenches. FIG. 6H shows the micro-device array after the wafer has been immersed in a selective etch solution such as KOH. It is well known that KOH etches Silicon with a very strong dependence on crystal face orientation, with the etch rate of (111) KOH etches Silicon with a very strong dependence on crystal face orientation, with the etch rate of (111) surface being at least 100× slower than the rate for surfaces at other orientations. Therefore, it etches laterally far faster than vertically through the (111) oriented substrate of the shown embodiment. This unique feature allows very controllable creation of cavity 127 underneath the micro-LEDs. The etch rate of KOH through SiN or SiO2 is very slow. Therefore, the dielectric protection layer 113 will remain on the sidewall of the device. After the etch is complete, care must be taken in removing the etchant, to avoid device breakage.

While most of the above discussion of device fabrication from FIG. 4A onwards has used the example of a Silicon substrate, essentially the same processes apply to the case of red micro-LED fabrication, where substrate 101 is GaAs and n-layer 103 is GaAs and AlGaAs. To avoid the etch of n-layer 103, the buffer layer (such as InGaP) 102 must serve as an etch stop. This is achieved by using $H_2O_2$ based etchants to create the cavity underneath the micro-LEDs.

Care must be made after cavity 127 is created because the micro-LEDs now are suspended via the hinges 130 from posts 124. After cavity etching, the substrate can be dried using the well-known critical point drying process, in which liquids self-remove with minimal disturbance to surrounding structures (in this case, the suspended micro-devices).

After the substrate is dried, the fabrication of the micro-LED array is completed. Although the description above has covered the use of typical or exemplary materials and fabrication steps, those who are familiar with the field know many other steps and materials can be used to produce similar micro-structures that will then be amenable to handling in ways corresponding to those to be described below.

Returning to FIG. 6H, the cross-section view depicted shows the essential elements of an array 150 according to one embodiment of the present invention. Array 150 comprises substrate 101 and a plurality of micro-devices 140A, 140B etc suspended over a cavity 127 in the substrate. Each device is suspended by one or more lateral hinges 130, each hinge being attached to a side post 124 formed into and attached to substrate 101. Each micro-device comprises a bonding layer 115; a metal contact 110; semiconductor device layers 103, 104, 105; and buffer layer 102.

FIGS. 4A through 6H depict cross sectional (side) views of the micro-array structures during their formation. The positioning of the posts relative to the micro-devices can vary for different embodiments depending on the design objectives.

Figure 7A:
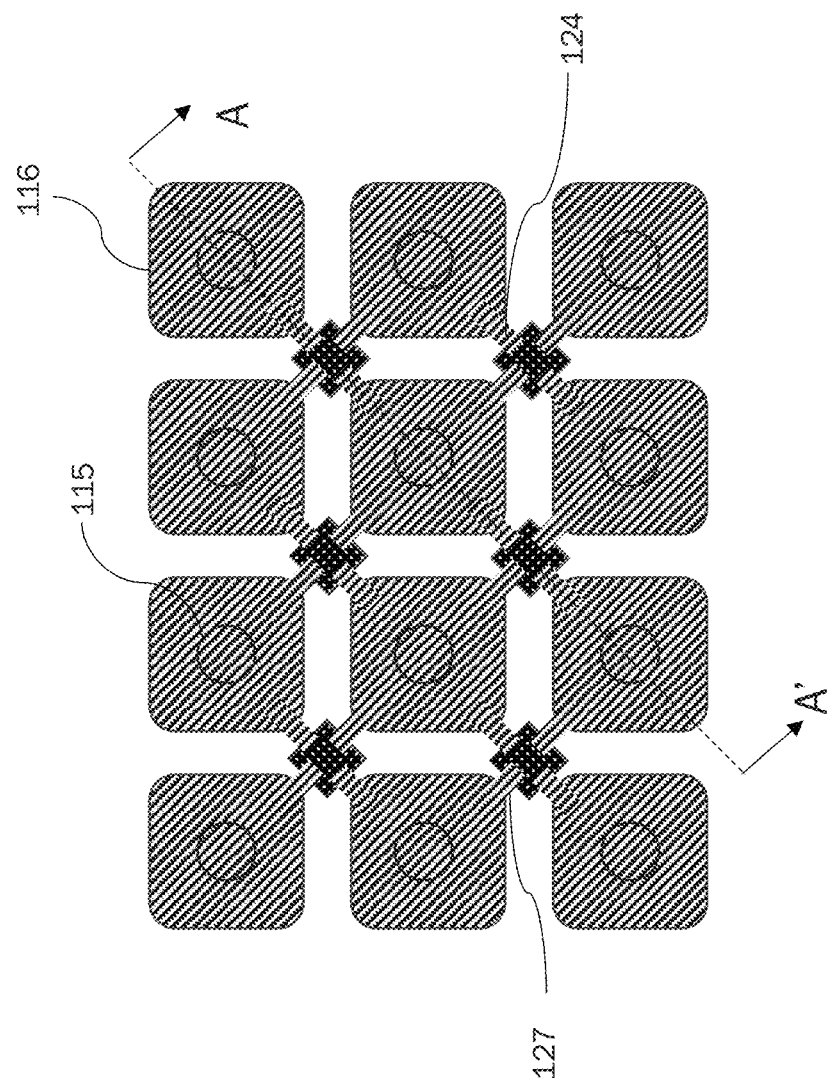
FIG. 7A is a top down view of a layout of a micro-device array according to one embodiment.
Figure 7B:
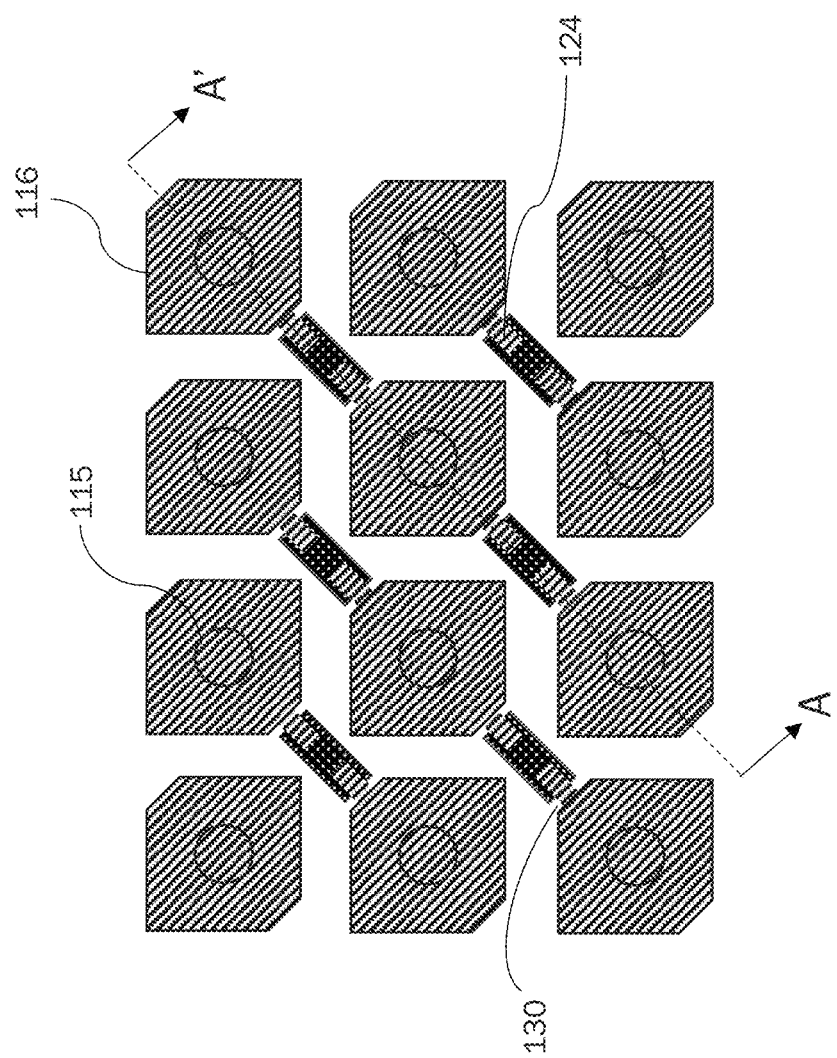
FIG. 7B is a top down view of a layout of a micro-device array according to another embodiment.
Figure 7C:
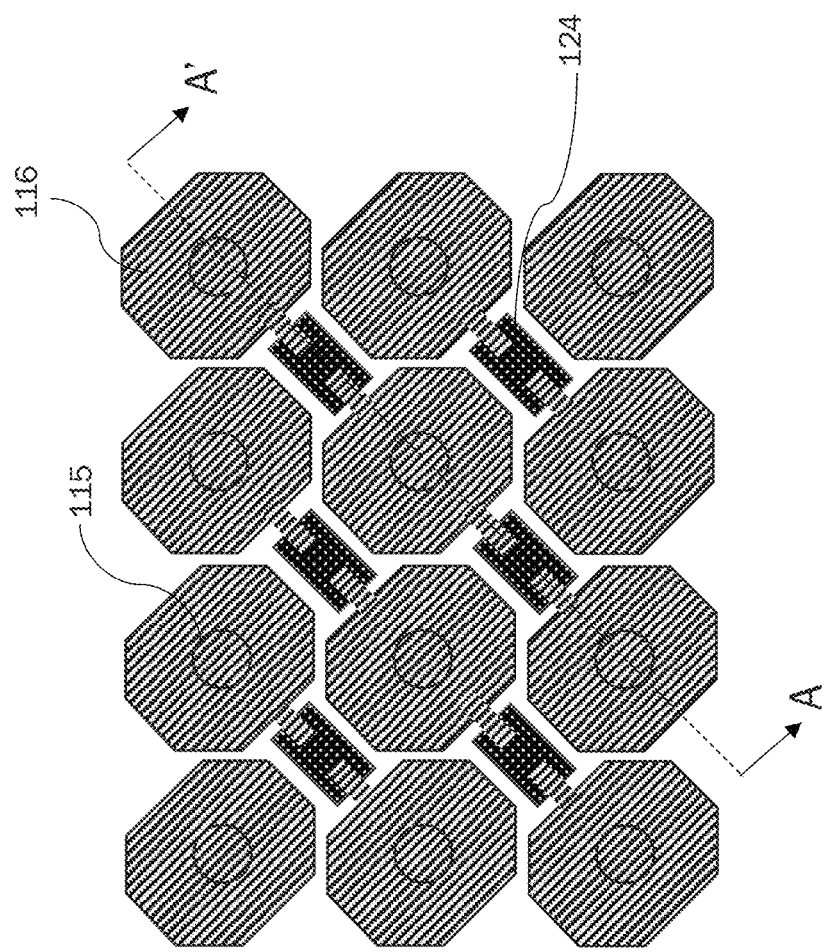
FIG. 7C is a top down view of a layout of a micro-device array according to yet another embodiment.
Figure 7D:
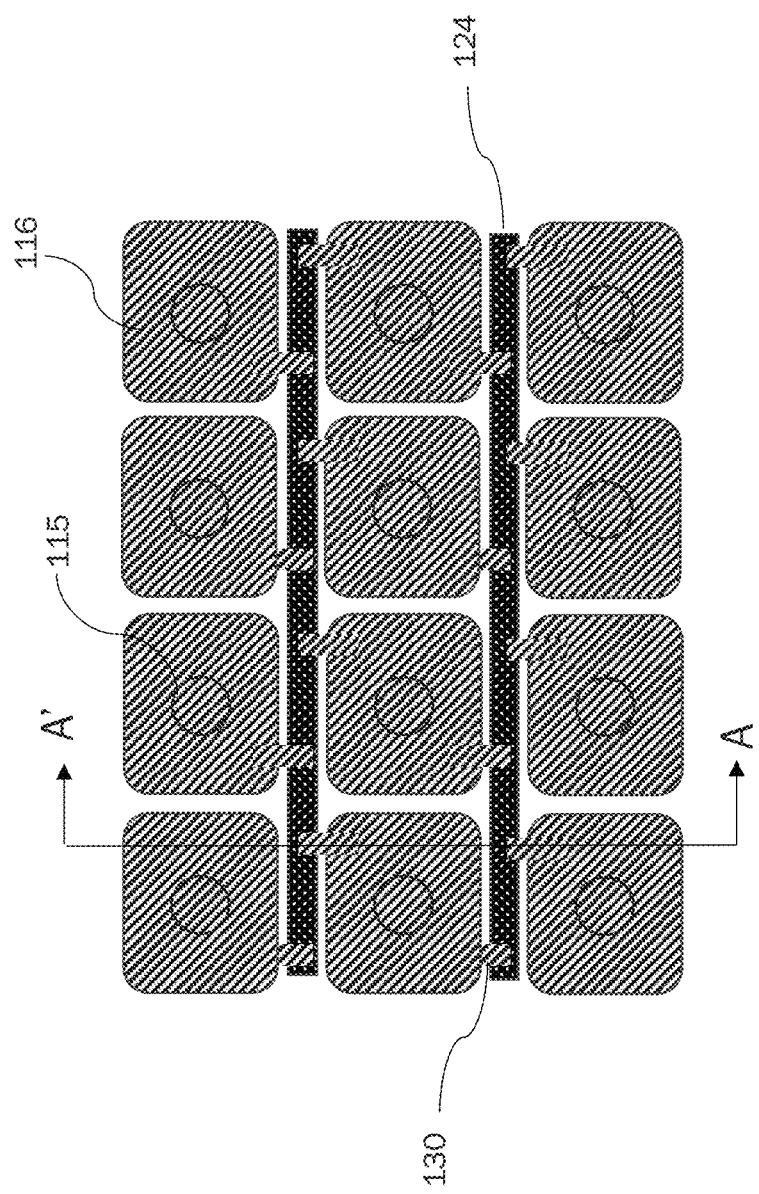
FIG. 7D is a top down view of a layout of a micro-device array according to yet another embodiment.

FIG. 7A illustrates a top down view of one possible layout of a micro-device array, in which (except for around the edges of the array) each micro-device 140N is connected by four hinges 130, one at each corner of the device, to four corresponding posts 124. This design may result in weak posts, if the post dimensions are very small. The dashed line AA' indicates the direction along which, if the device were "cut", the cross-sectional view would appear roughly as shown in FIG. 6H. FIGS. 7B and 7C show top down views of alternative layouts using rectangular posts with different widths, corresponding to different trench widths 121 (see FIG. 5A). Another design layout choice is whether the hinges can run only along one direction (as shown in FIGS. 7B and 7C) or two orthogonal directions (as shown in FIG. 7A). FIG. 7D shows another layout in which one continuous post running parallel to and in between two rows of microdevices is shared by all of those micro-LEDs. Such layouts require separate masking steps and material for hinge formation, as noted above. In yet another layout, not shown, the posts can be positioned in a grid form for maximizing the strength of the posts and the fill factor of micro-LEDs.

FIGS. 7A through 7D only illustrate embodiments where posts are laid out in arrangements with rectangularly symmetry. In other embodiments, post layouts may follow any of a variety of other symmetries, as long as they provide sufficient support to the suspended micro-LEDs. The cross section of the posts can be round or rectangular, or of any other practical shape.

The structural features of the arrays disclosed in this application allow micro-devices in the arrays to be individually transferred from the substrate on which they are formed to other substrates or destinations, with precision and reliability. In brief, in the case of a transfer, if a selected device is first "held" by a pickup head, for example by applying a voltage difference between the head and the top surface of the device, creating an electrostatic attraction therebetween. Then, a mechanical force is applied to lateral hinges connected to the device, by pushing the device towards the substrate; the hinges will break, leaving the previously suspended device free to be lifted away from the posts and the substrate by the pickup head. The pickup head may then be moved to a desired destination location, and if and when the force holding the device to the head is overcome by a competing force with respect to the destination site (involving applied voltage again, or a adhesive-coated surface, for example), the device will be released. In the interim period between picking up and releasing the device, it may be accessed for testing. The details of how such transfer may be executed and other benefits provided subsequent to the device transfer, for example device testing, will be disclosed in other related applications.

It should be noted that prior to the present invention, the size of the gap between a micro-LED and the corresponding substrate surface, created by etching of sacrificial layers, is very small, necessitating the use of compliant pickup heads to accommodate inevitable departures from perfectly flat surfaces. Such a pickup head would probably not be able to handle multiple devices. In the present invention, gap sizes may be much larger, 5 µm for example, allowing a single, non-compliant pickup head to be used. In addition, it is possible to break the hinge by pushing suspended devices via the pickup heads toward the substrate.

Figure 8A:
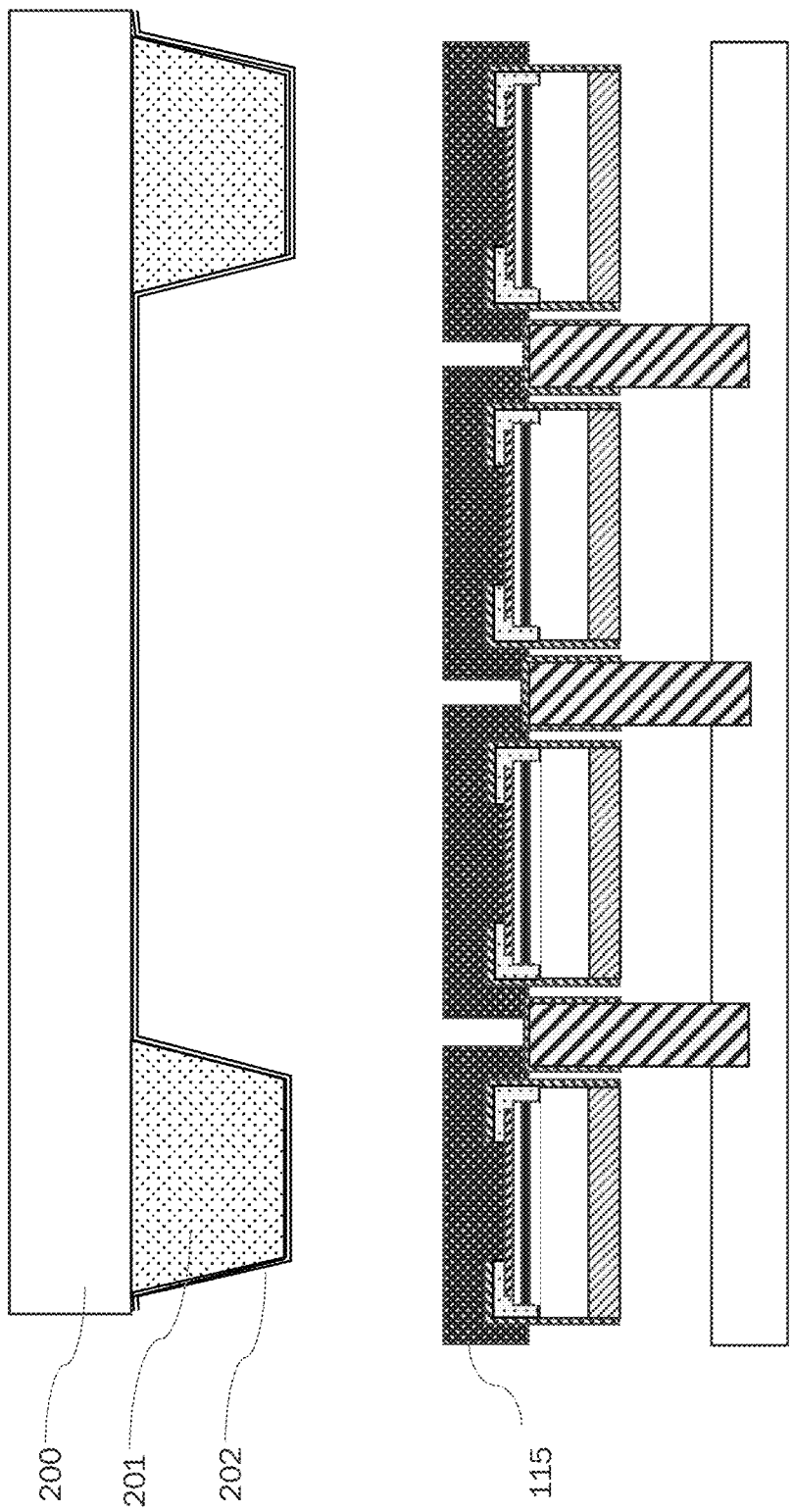
FIG. 8A is a cross section view through a substrate after the first step of a micro-device pickup process according to one embodiment.

Now referring to FIG. 8A, a pickup substrate 200 having an array of pedestals are brought close to the micro-LED substrate. Each pickup pedestal 201 has one or more electrodes capable of supplying voltage. The surface is coated with dielectric layer with the thickness optimized for highest electrostatic force.

When the pickup heads are brought close to the micro-LEDs, charges are induced at the surface of the bonding layers. If a bipolar mode is used, both positive voltage and negative voltage are supplied to the electrodes embedded in the pickup pedestals, the net charge induced to the bonding layer surface is zero. This is a consideration when insulating posts are used. However, if the posts are made of conducting materials, such restriction is not required.

The amount of induced electrostatic charges is inversely proportional to the gap between the pedestal and the bonding layer. Only the micro-LEDs very close to the pedestals will experience significant electrostatic force. The distance range referred to by "very close" will depend on the applied voltage. For example, a range of up to approximately 1 um would correspond to a voltage of 25V, and up to approximately 3 um would correspond to a voltage of 100V. High voltages risk device damage, so a compromise must be reached to optimize pedestal height.

Figure 8B:
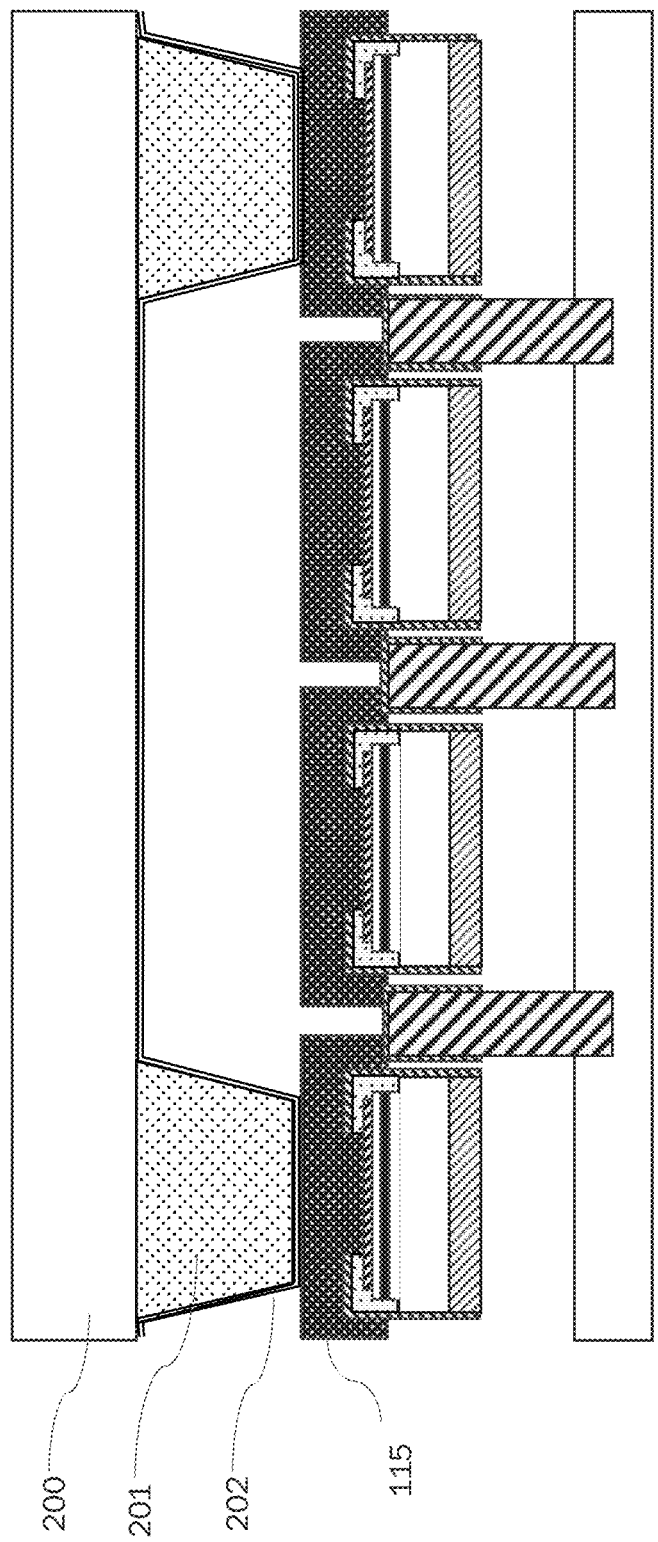
FIG. 8B is a cross section view through a substrate after the second step of the pickup process for the embodiment of FIG. 8A.

As shown in FIG. 8B, the pedestals are brought into contact with the micro-LEDs. It should be noted that the periodicity of the pedestals is not the same as the periodicity of the micro-LEDs. The distances between the pedestals are selected according to the applications.

Although in FIG. 8B, two pedestals are shown to be in contact with the micro-LEDs simultaneously, it is not practical to design a pickup process by assuming that such uniform contact can be achieved in a real process. In practice, all substrates might have warpage or non-ideal flatness of the surface. Typically, in the current state of the art, silicon wafers have warpage in the order of 5 um across 8" wafers. So, while local flatness as shown in FIG. 8B is possible, it is not reasonable to assume such flatness and parallelism can be achieved easily between two substrates.

Figure 8C:
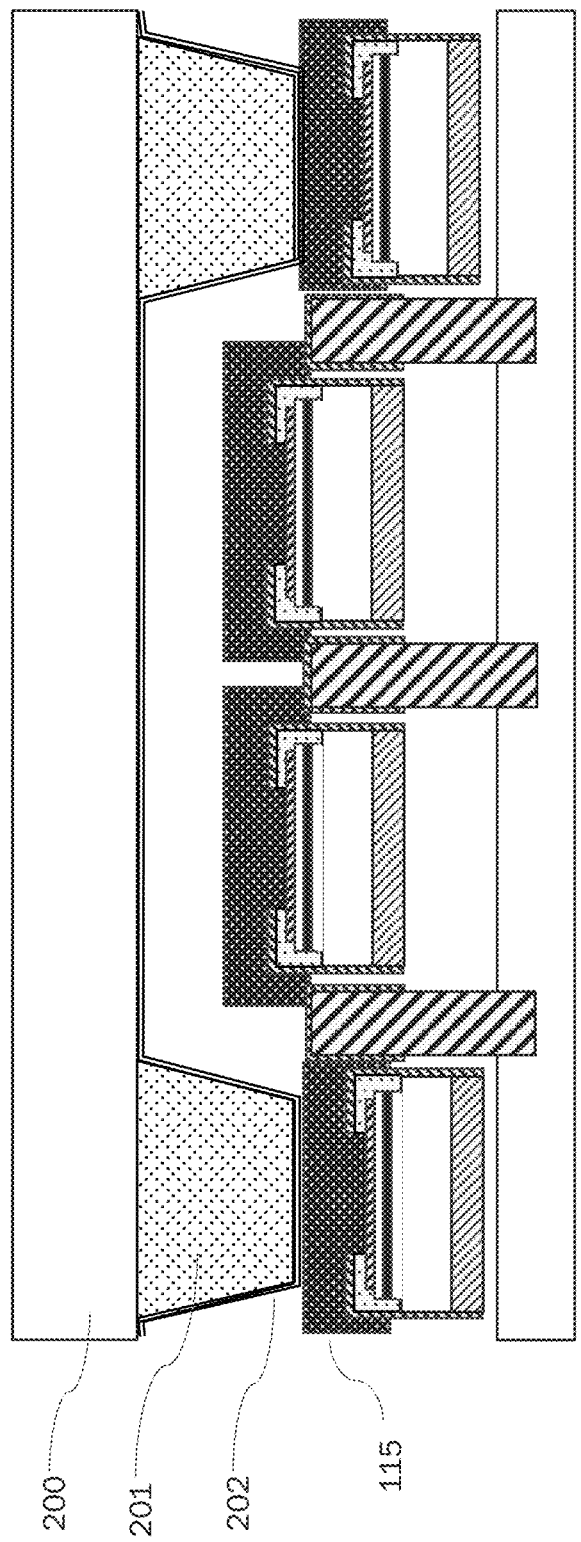
FIG. 8C is a cross section view through a substrate after the third step of the pickup process for the embodiment of FIGS. 8A and 8B.

To overcome this non-ideal flatness, the pickup technique disclosed herein allows the pickup substrate to be pushed against the micro-LED wafer as shown in FIG. 8C. By allowing the push into the micro-LEDs substrates, it accomplishes two things: (1) breaking the hinges which suspend the micro-LEDs, (2) allowing the contacts of all pedestals to the intended micro-LEDs. Now, one can appreciate the existence of the large cavity beneath the micro-LEDs which is made possible by this invention. In the prior art, the cavity was formed by a deposited sacrificial layer and the attachments of micro-LEDs to the supporting post is done by undercut etch of one of the dialectic layer.

As discussed above, the hinges can be made of different materials as the bonding layer if desired.

Figure 8D:
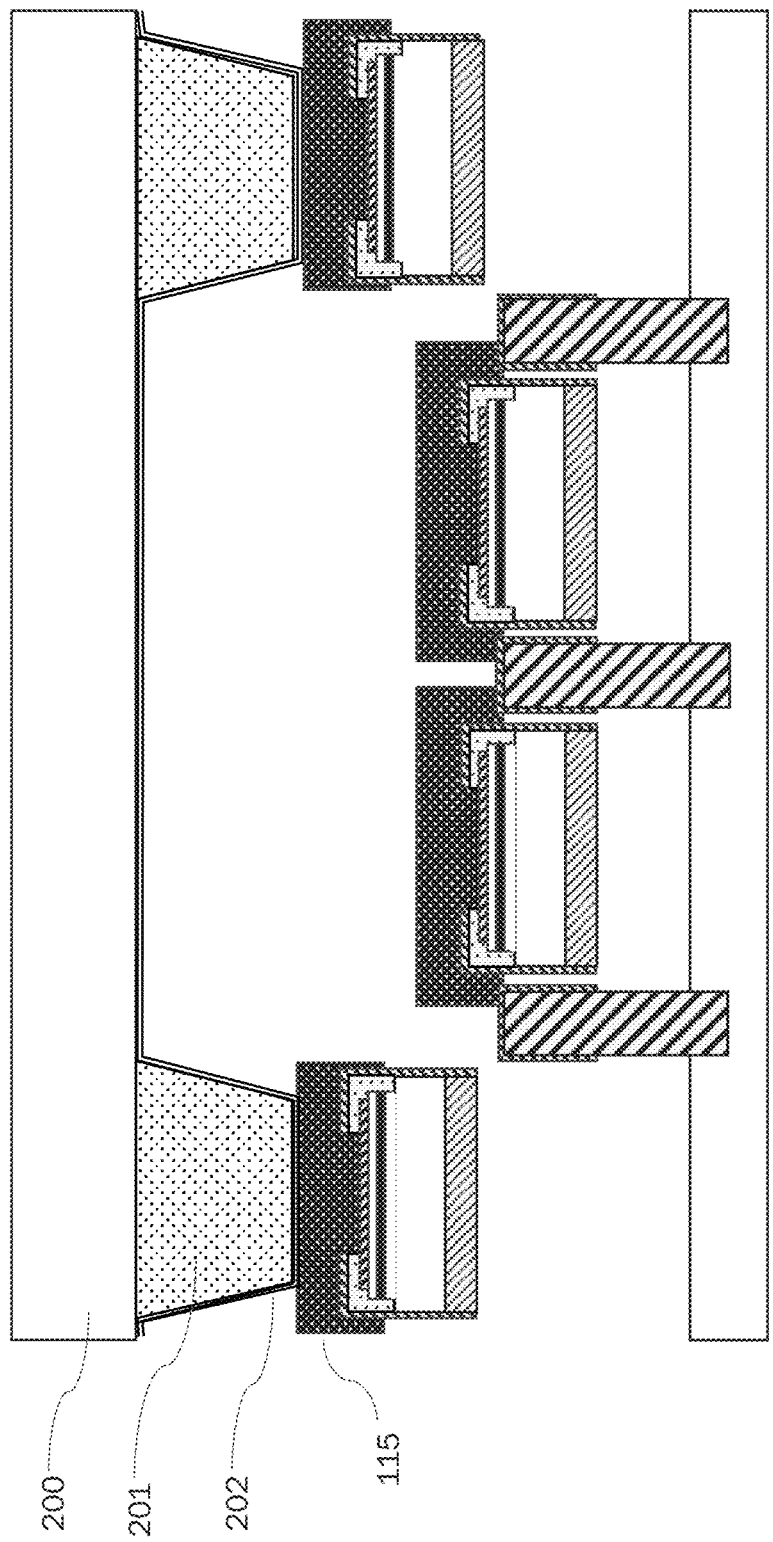
FIG. 8D is a cross section view through a substrate after the fourth step of the pickup process for the embodiment of FIGS. 8A, 8B and 8C.

FIG. 8D depicts the removal of micro-LEDs by the pickup substrate when the substrate is lifted. The pickup is done by electrostatic force induced by the supplied voltage. Because there is no other competing force, the micro-LEDs are attached to the pedestals.

Before transferring the micro-LEDs to its destined board or substrate, a temporary receiving substrate may be used for an intermediate holder. There are many benefits for having such temporary holders.

First, it is beneficial to allow a visual inspection to be performed to see any physical damaged parts are present. If any part is damaged or even missing, a replacement action can be done prior to the final transfer.

Second, as described above, only p-metal contacts are made for the micro-LEDs. At this point, there is no clear way to perform any electrical test. However, any semiconductor process has some yield loss. Without testing, defective devices might be assembled into final product. So, it is beneficial to perform some screening tests of micro-LEDs. One approach is to perform a photoluminescence test (PL). This is an optical test which does not require electrical contact, but does require optical transparency. Referring to FIG. 8D, once the micro-LEDs are lifted from the original substrate, the bottom surfaces of the devices can be exposed to the excitation light (light with shorter wavelengths than the emitted light). Any micro-LEDs that do not emit light of the desired wavelength and desired intensity may be screened out i.e. discarded, if such a PL test can be performed.

Therefore, in the present invention, a temporary receiving substrate is introduced, to address the issue of defective devices by providing an effective method of identification and replacement.

Figure 9A:
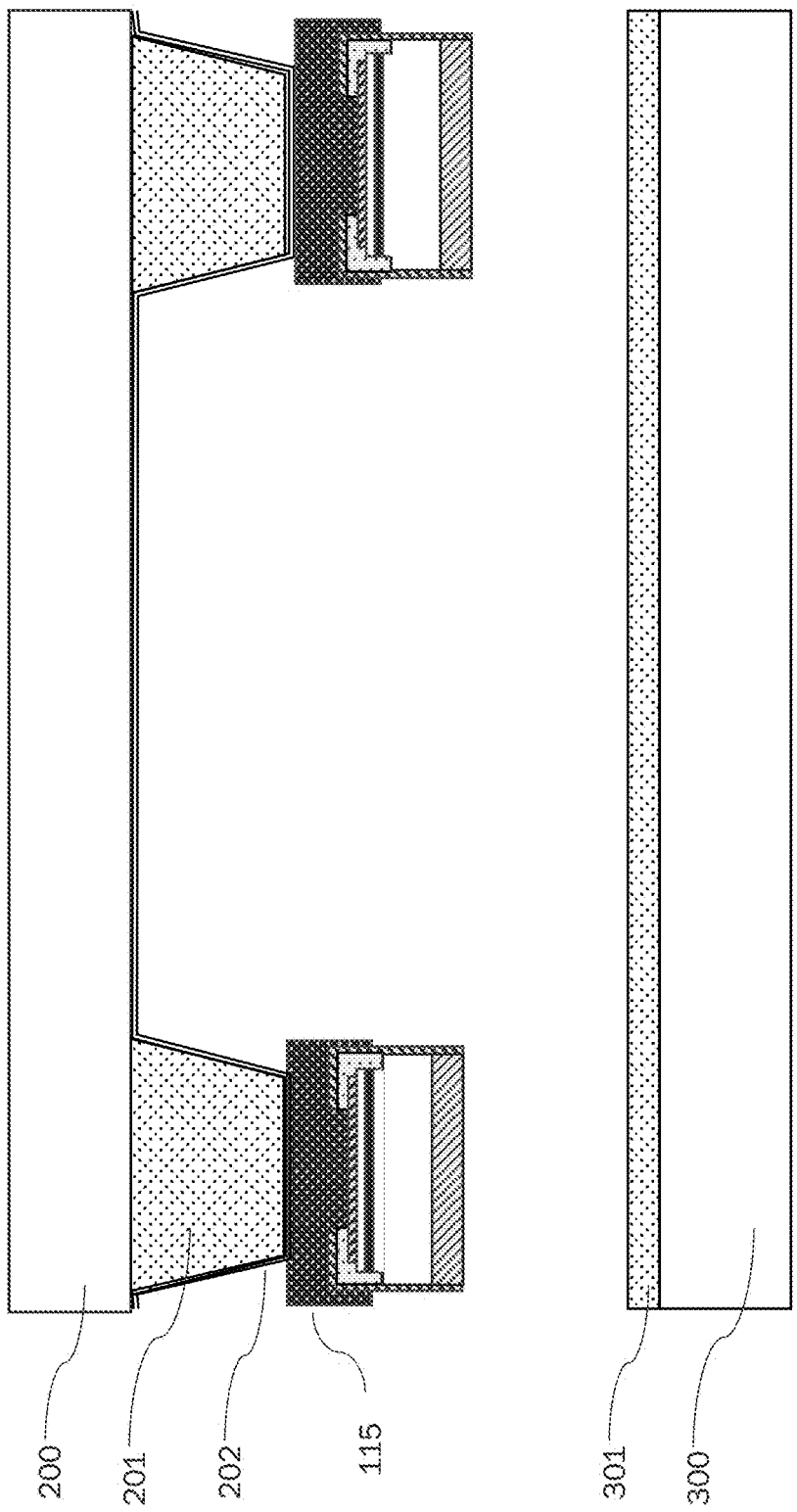
FIG. 9A illustrates the first step of a method of transferring a device to a temporary receiving substrate according to one embodiment.
Figure 9B:
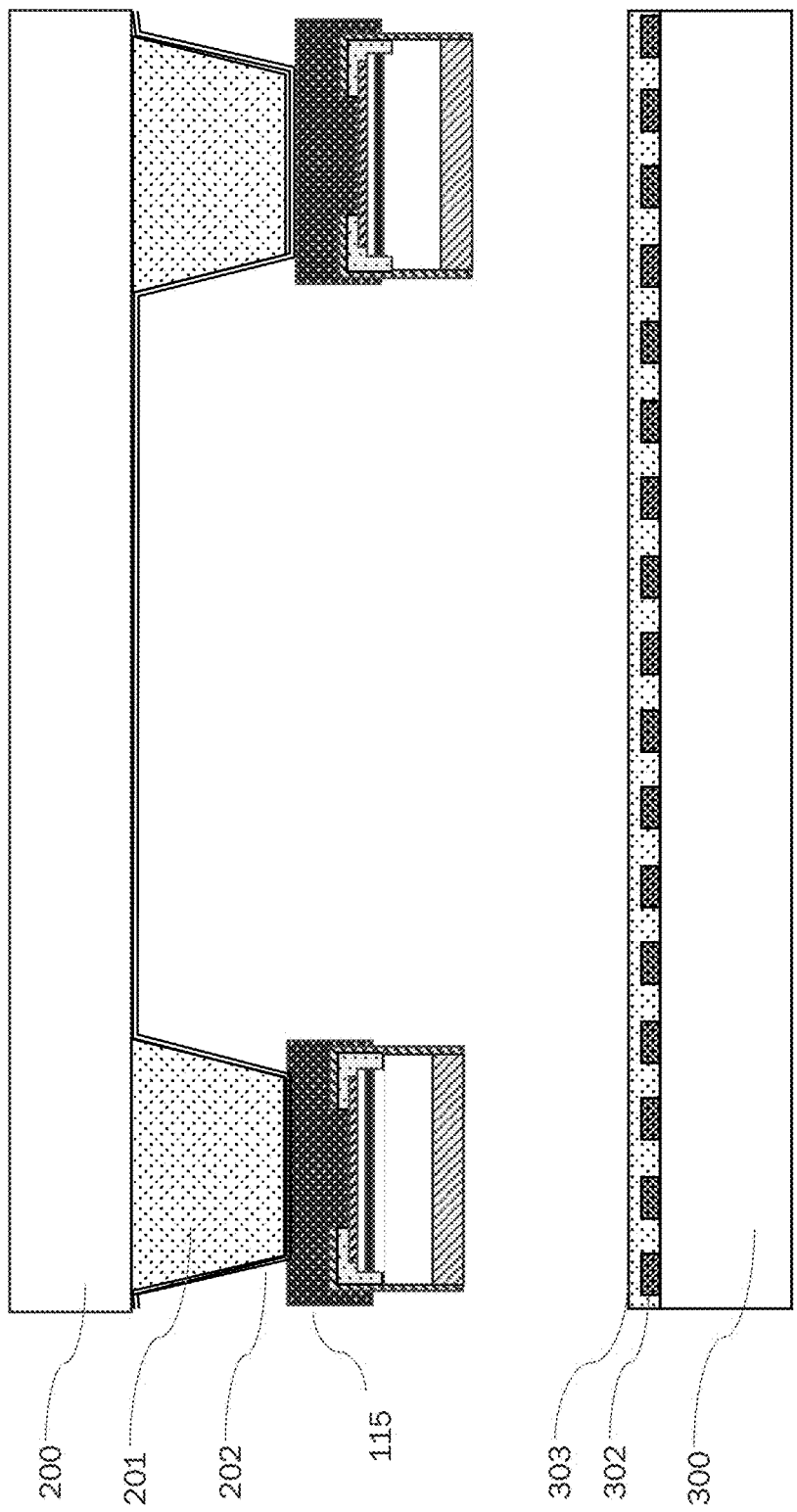
FIG. 9B illustrates the second step of a transfer to a temporary receiving substrate for the embodiment of FIG. 9A.

As shown in FIGS. 9A and 9B, two possible temporary receiving substrates are illustrated, without losing generality of other possibilities. In FIG. 9A, the temporary receiving substrate 300 is coated by a soft material such partially cured photoresist or BCB 301. When this type of material is not fully cured, the surfaces are still tacky. Once the micro-LEDs are placed on the tacky surface, the surface bonding can be sufficient to keep the devices from moving or falling off.

In FIG. 9B, a more reliable approach is accomplished by using interdigitated electrodes 302 covered by a thin dielectric coating 303. It may be beneficial to apply voltages selectively, i.e. to only some rather than all electrodes 302, so that electrostatic forces are created only in the areas of immediate interest for the device or devices to be picked up at a given time. It is quite easy to control the application of the voltage selectively via a control circuit. For example, if one device is identified as defective, the voltage applied to the electrodes underneath that device can be selectively removed, and the device can be easily removed by another special process such as using a single pickup head with an applied electrostatic force. After the removal of the defective devices, working devices can be aligned and placed into the vacated locations.

This replacement process is extremely important to make the high definition display to work. With more than millions of micro-LEDs in one single high definition display, even a yield of 99.999% will not be sufficient to make a defect less display. Therefore, although it appears to be an extra step toward the destined display board or substrate, this temporary receiving substrate is a very important step of the overall invention.

Figure 9C:
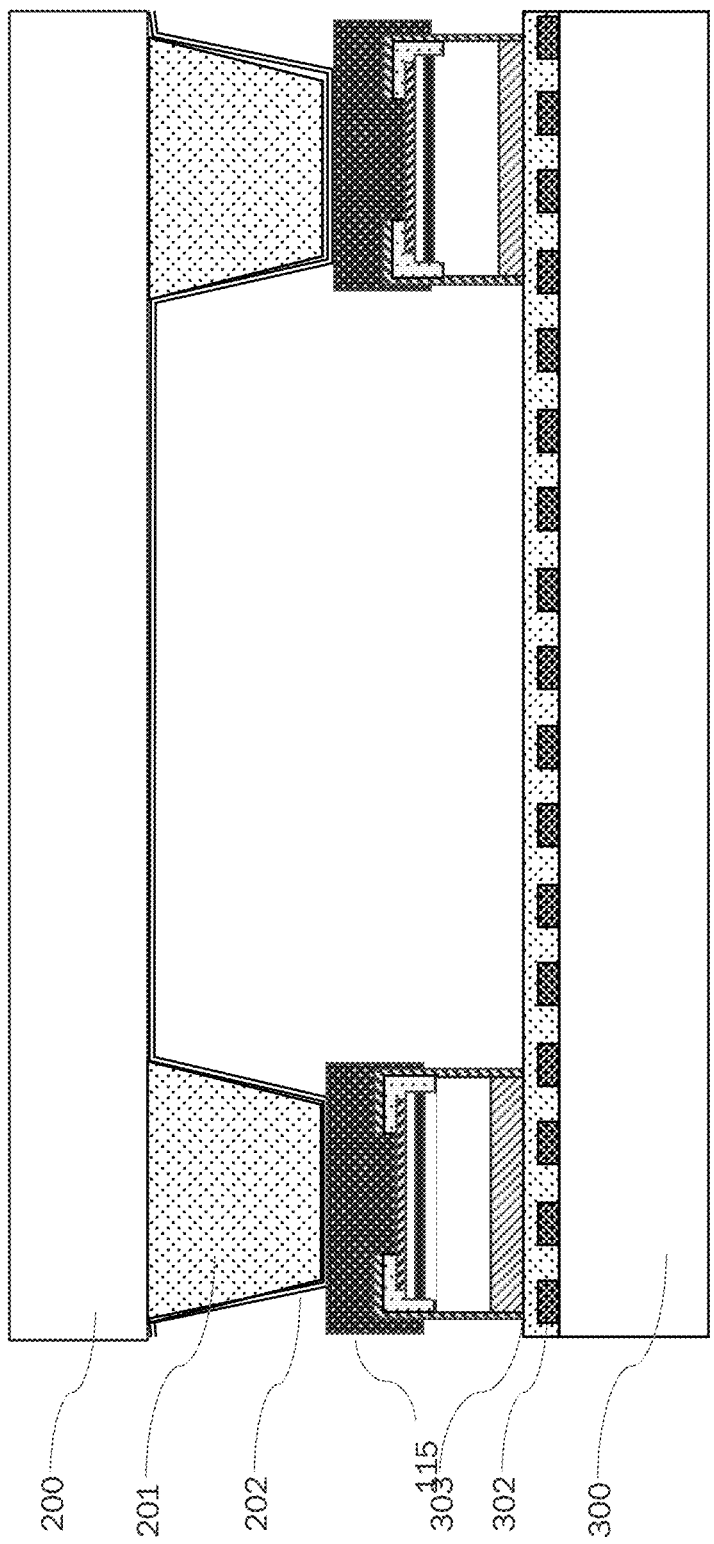
FIG. 9C illustrates the third step of a transfer to a temporary receiving substrate for the embodiment of FIGS. 9A and 9B.

As shown in FIG. 9C, the pickup substrate 200 is positioned to the proximity of the temporary receiving substrate 300. Although it is shown that all micro-LEDs land to the top surface of the temporary receiving substrate 300, it might not be necessary to make physical contact. During the transfer steps, after the micro-LEDs are close to the temporary receiving substrate 300, the voltages are selectively applied to the interdigitate electrodes. Thus, the electrostatic force will apply to the micro-LEDs from the bottom side. The, the voltages on the pickup substrate are removed, thus the electrostatic force from the top side is removed.

Figure 9D:
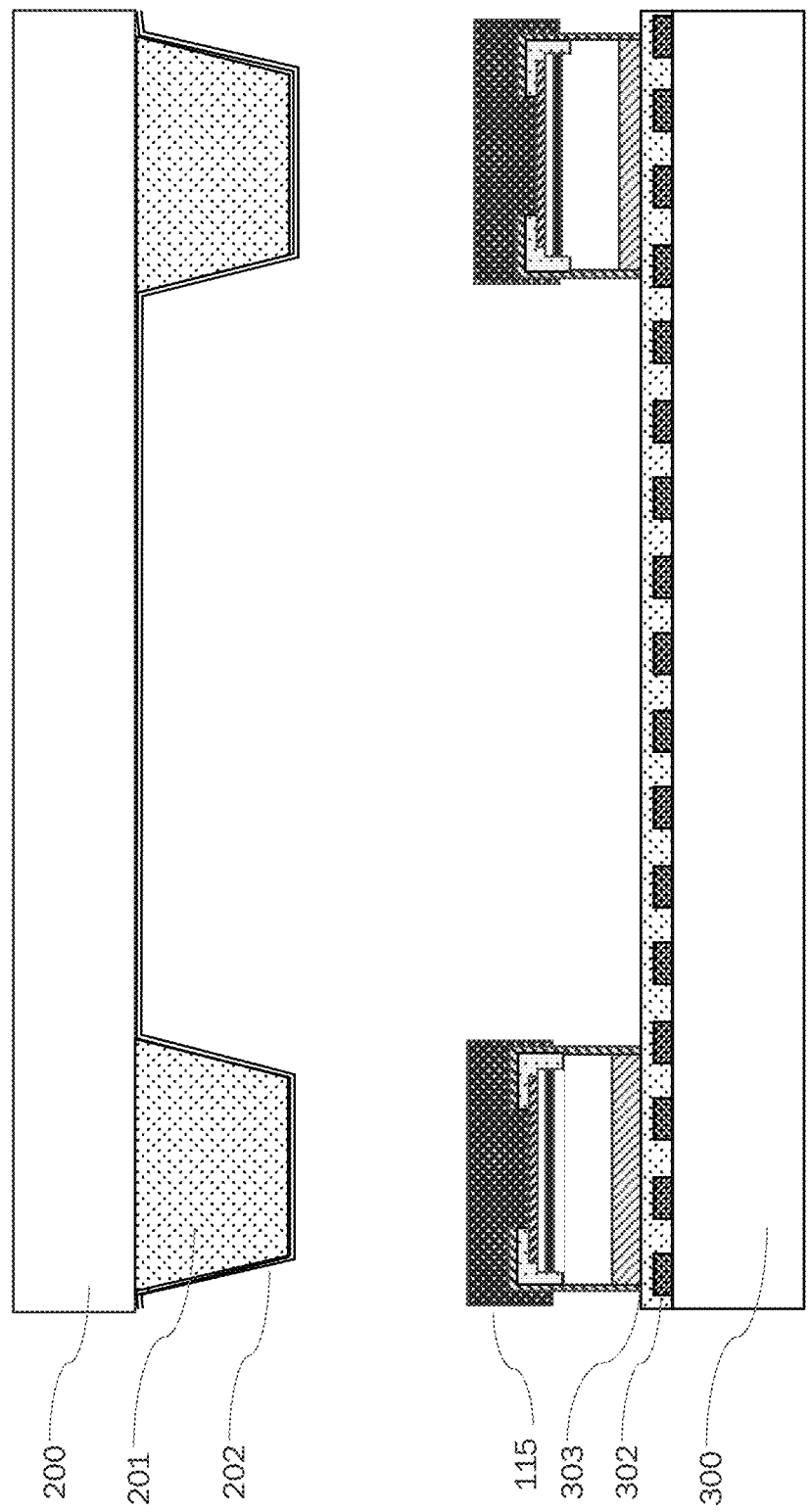
FIG. 9D illustrates the fourth step of a transfer to a temporary receiving substrate for the embodiment of FIGS. 9A, 9B and 9C.

After the electrostatic force from the top is removed, the pickup substrate 200 is lifted and the micro-LEDs will be held down by the electrostatic force from the bottom as shown in FIG. 9D. As discussed above, this temporary transfer gives an opportunity to replace any defective devices, electrically or physically.

Figure 10A:
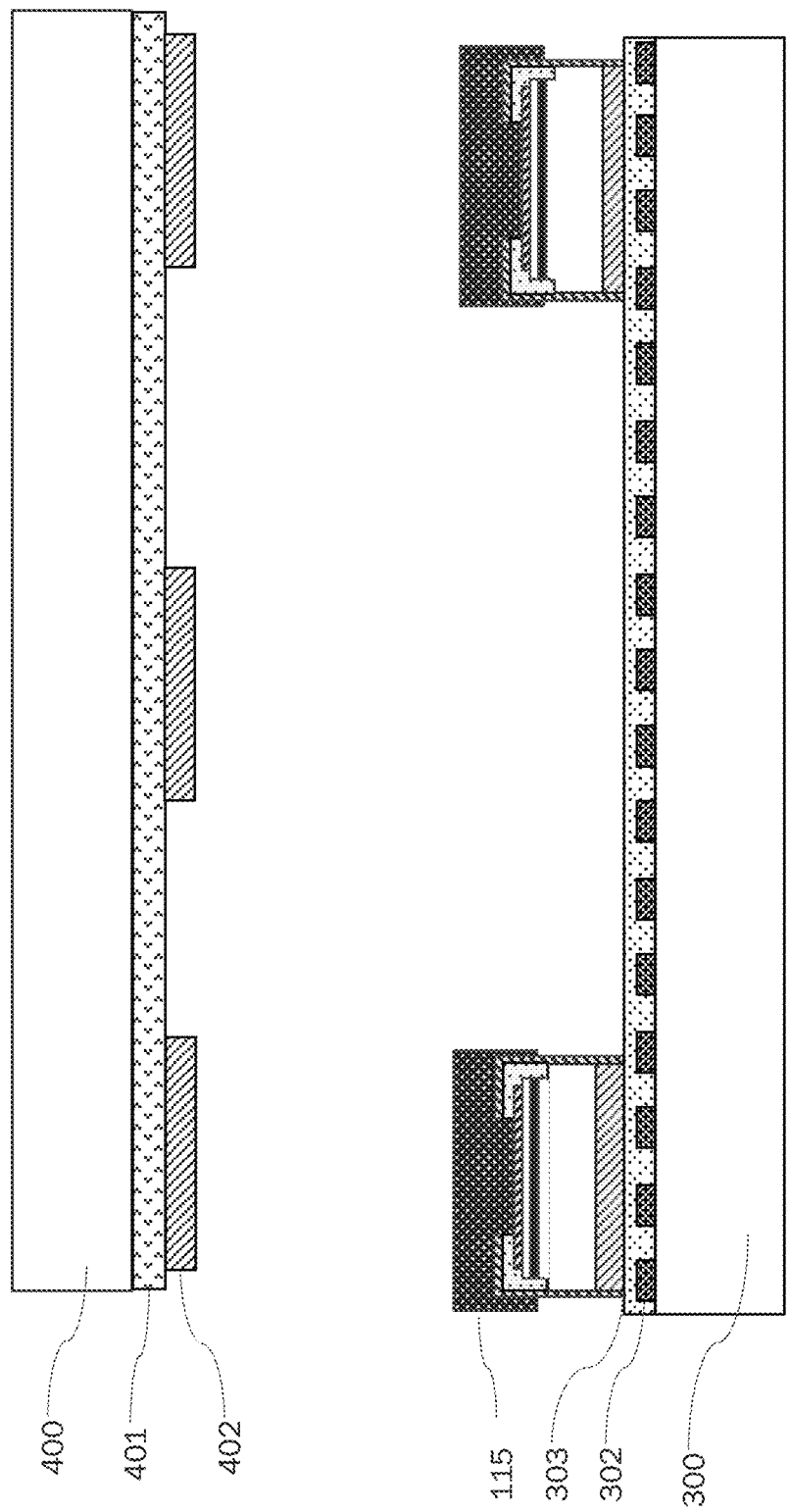
FIG. 10A illustrates the first step of a transfer and micro-LED interconnect process involving a temporary receiving substrate and a receiving substrate according to one embodiment.

In FIG. 10A, the final receiving substrate 400 is positioned and aligned to the temporary receiving substrate 300. On the receiving substrate 400, many metal pads 402 are defined by lithographic process. Optionally between the substrate 400 and the metal pads 401 are insulating layer 401 if the substrate is conductive such Aluminum or other materials.

The metal pads 402 are for various purposes. For example, some pads are for blue LEDs, some pads for green LEDs, and some for red LEDs. Moreover, some pads can be used for control circuit to drive the LEDs. Moreover, some pads are used photodetectors. It is very clear that all these different devices might not have the same thickness. To transfer different types of devices to the same substrate will require some accommodations of tolerance and interference.

Prior to transfer the micro-LEDs to the receiving substrate 400, the temperatures of both substrates increased by heaters attached to the holders of the substrates. Once the temperature of the temporary receiving substrate 300 is high enough, the bonding metal melts and balls up because of the surface tension of liquid metal surface. The surface energy between the bonding metal and the surround dielectric material should be chosen to be smaller than the surface energy of the bonding metal. This technique is quite well known in the industry for making ball grid array. This is also the reason why the opening of the p-metal contact is purposely made much smaller than the area of the p-contact stack to facility such form change. For example, if the micro-LED is 30 um×30 um, the p-contact opening is 5 um×5 um, and the bonding layer is 2 um thick, the height of the metal ball will be around 15 um which is large enough to accommodate the tolerance between various mechanical imprecision.

Figure 10B:
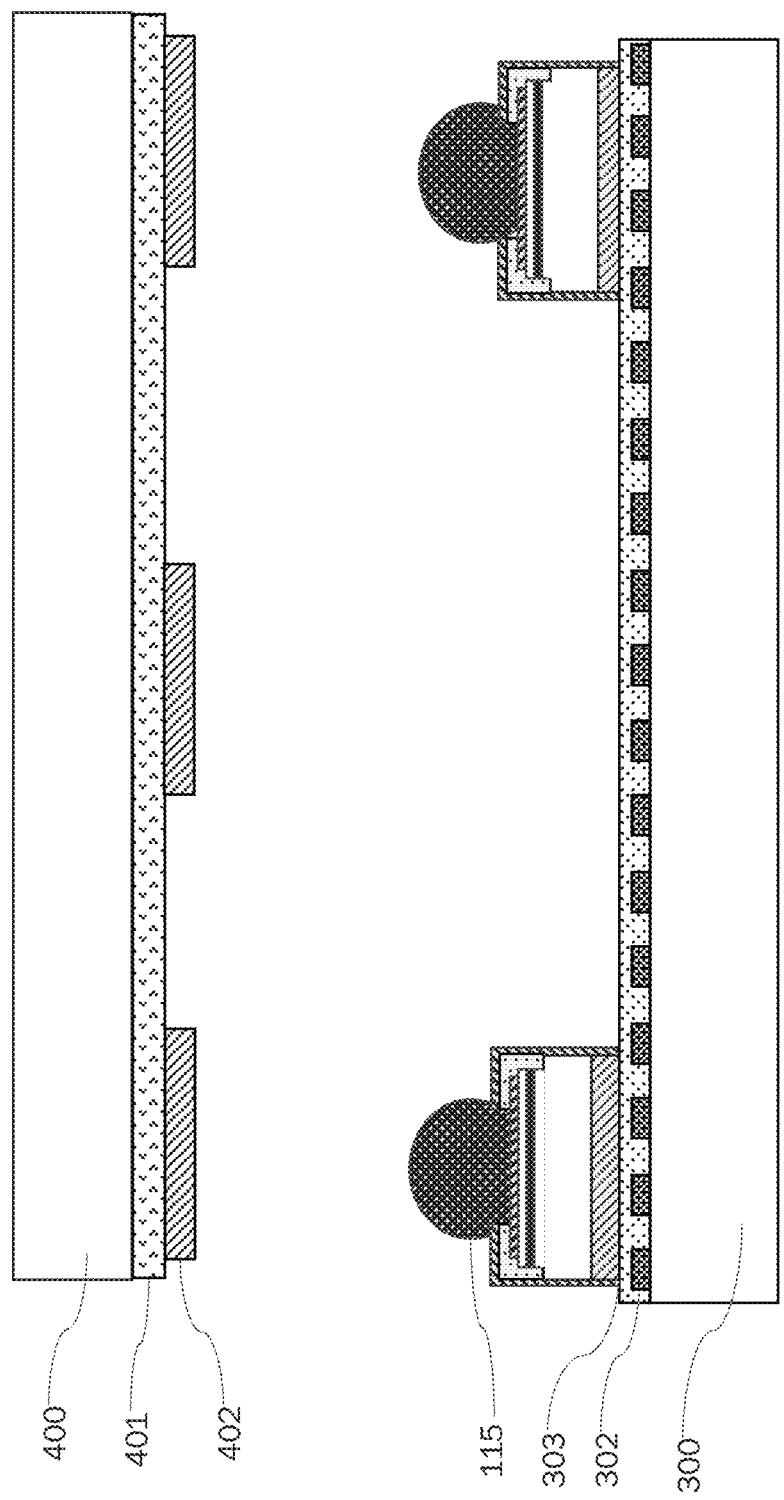
FIG. 10B illustrates the second step of a transfer to a temporary receiving substrate for the embodiment of FIG. 10A.
Figure 10C:
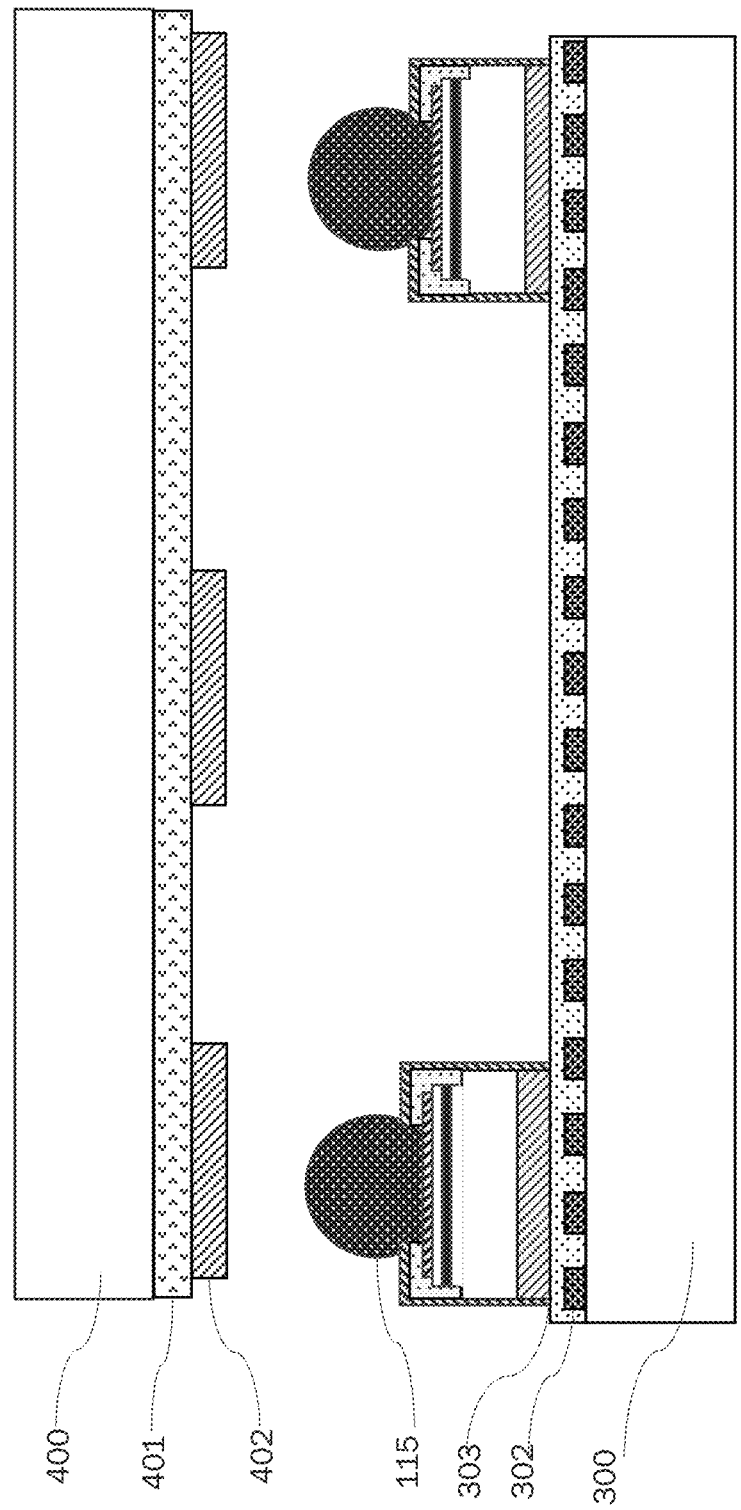
FIG. 10C illustrates the third step of a transfer to a temporary receiving substrate for the embodiment of FIGS. 10A through 10B.
Figure 10D:
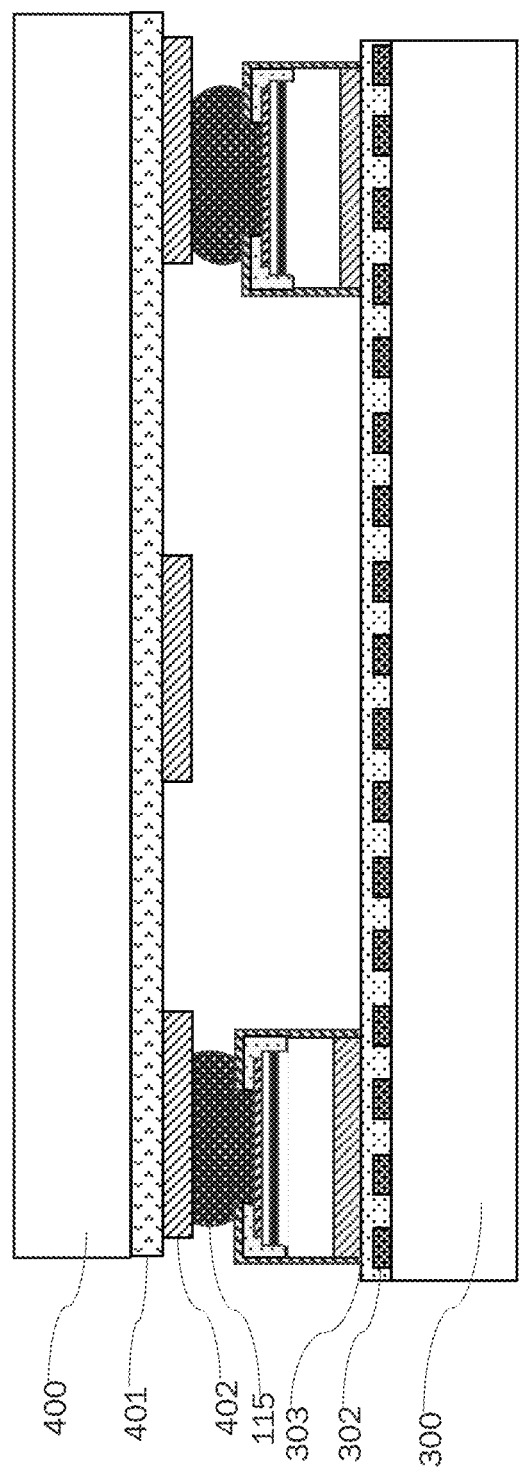
FIG. 10D illustrates the third step of a transfer to a temporary receiving substrate for the embodiment of FIGS. 10A through 10C.

Now, the receiving substrate 400 is brought to touch the temporary receiving substrate 300 as shown in FIGS. 10B, 10C and 10D. As depicted in FIG. 10D, the alignment between the metal pad 302 and the micro-LEDs might not be perfect. This kind of misalignment can be caused by many practical reasons, such as lateral alignment, angular misalignment, different thermal expansion coefficients of different substrate materials, and etc. Also in FIG. 10D, it is shown the bonding metal is pressed and deformed because the gap difference between various location might be different.

Figure 10E:
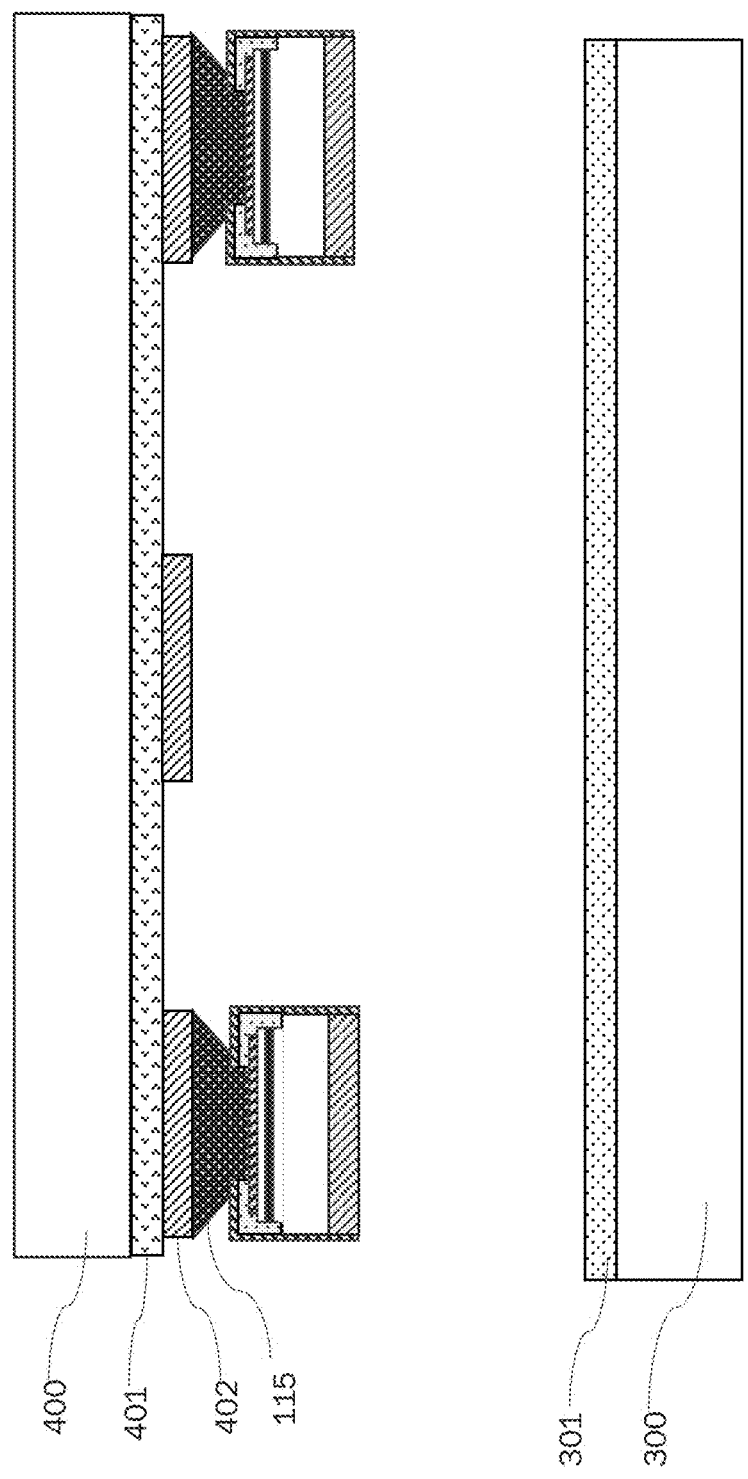
FIG. 10E illustrates the third step of a transfer to a temporary receiving substrate for the embodiment of FIGS. 10A through 10D.

But, all these imperfections due to mechanical tolerances are removed when the pickup head is lifted. The wetting of bonding metal to the metal pad 402 will maximize the surface area at the top and perform a self-aligned adjustment, as shown in FIG. 10E. The micro-LEDs will be precisely positioned based on the metal pads, rather than the pickup head. This is a very important feature of this invention.

As discussed above, replacement of micro-LEDs might be necessary. Having millions of micro-LEDs for one single display, a yield of 99.99% is not sufficient. Therefore, before the final assembly, the defective micro-LEDs need to be identified and replaced.

Figure 13:
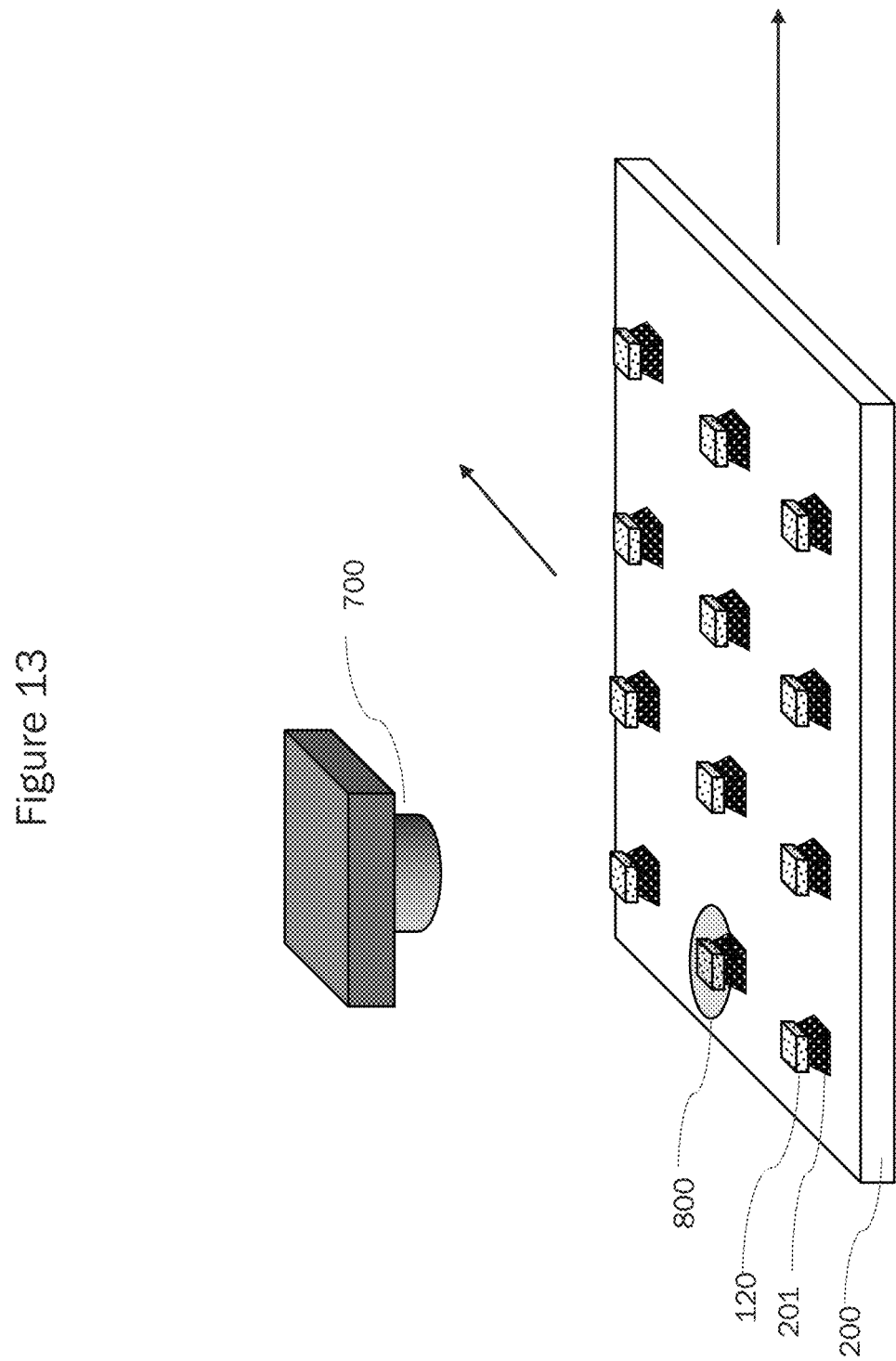
FIG. 13 illustrates a method for contactless testing of micro-LED according to one embodiment.

The defects of micro-LED can be mechanical or electrical. The mechanical defects can be determined using computer-added vision inspection. The electrical defect can be detected by photoluminescence as shown in FIG. 13 in which the micro-LEDs 120 on the pickup substrate 200 are scanned under an excitation optical beam. When the excitation light 800 is absorbed by the LED materials, electrons and holes are generated and they drift to the active region. These electrons and holes recombine and emit light just similar to the light emission driven by electrical currents. A camera 700 is positioned on top of the micro-LEDs to capture the emitted light. Based on the intensity, the defective micro-LEDs can be identified. It is convenient to perform PL test on the pickup substrate. First, the focused excitation beam has a final size, such as 25 um diameter, which can be larger than the size of the micro-LEDs. In that case, it does not have the resolution to measure the responding emitting of each individual micro-LED. Even it could, precision alignment or registration can be done to isolated the response of each micro-LED. By measuring PL at the pickup substrate, the resolution is not an issue and the excitation beam can be made larger so that the registration of each micro-LED is not as critical. Second, once the micro-LEDs are picked up, the surface which is not coated by p-metal can be exposed to the excitation beam.

This unique feature should not be outlooked. Compared with prior art, the LEDs layers are transferred to a carrier substrate first through a bonding process after the p-metal is done. If the PL is used as contactless testing method, it will have to be done before or after the transfer.

For the prior art case where PL is done prior to the transfer, the PL system has to be precisely aligned to the p-metal and the excitation beam has to match the resolution of the micro-LED. This is possible but very challenging. For the case where PL is done after the transfer, the micro-LEDs are already bonded to the receiving substrate. So, even the defective micro-LEDs are identified, the replacement effort will be quite difficult.

Therefore, PL testing is not easy to carry out for micro-device arrays of the prior art. However, for micro-devices fabricated according to embodiments of the current invention, it is very straightforward.

Now, the advantages of having the temporary receiving substrate will become apparent. During the PL test, the camera can measure the intensity of the light emitted from micro-LEDs and perform visual inspection of the n-layer. Once the micro-LEDs are transferred to the temporary receiving substrate, another visual inspection can be performed on the p-layer side to ensure mechanical integrity of the micro-LEDs.

Figure 11A:
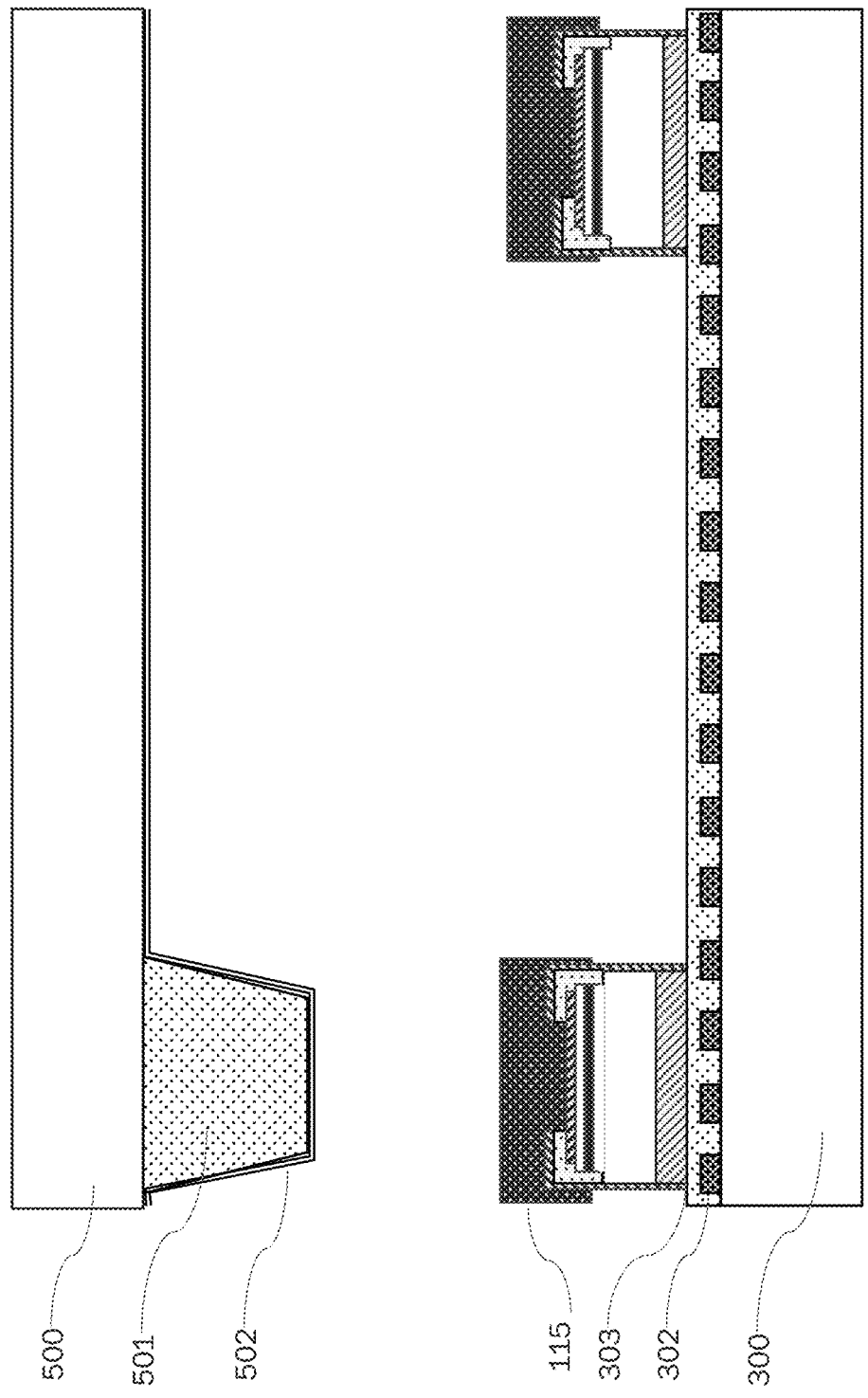
FIG. 11A illustrates the first step of a replacement process for a defective micro-LED according to one embodiment.

Once the defective micro-LEDs are identified, the replacements can be done by singular transfer to the temporary receiving substrate. As shown in FIG. 11A, a replacing pickup substrate 500 is brought to aligned to a defective micro-LED. This replacing pickup substrate can be very similar to the pickup substrate 200, except it has fewer or only one pickup pedestal 501. To ensure electrostatic force, the surface is coated with a dielectric layer 502.

Figure 11B:
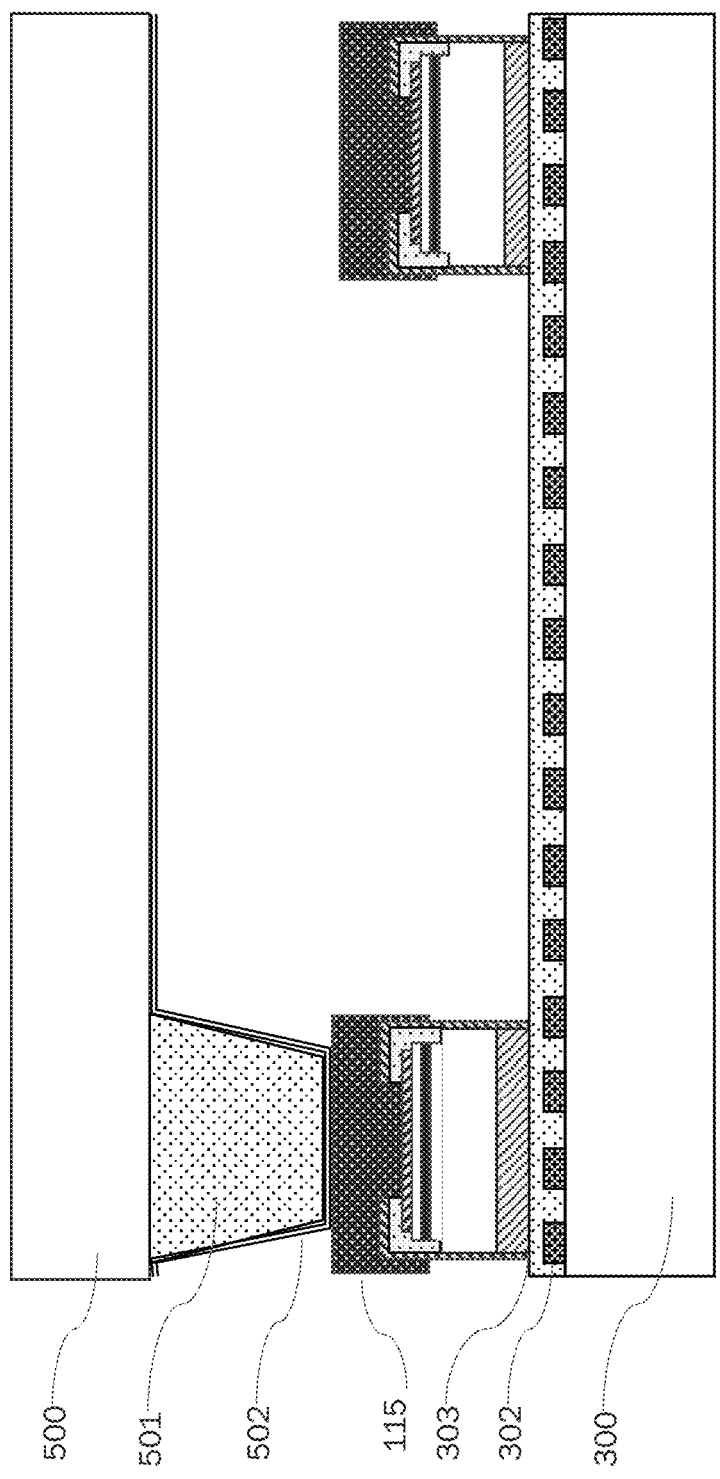
FIG. 11B illustrates the second step of a replacement process for the embodiment of FIG. 11A.
Figure 11C:
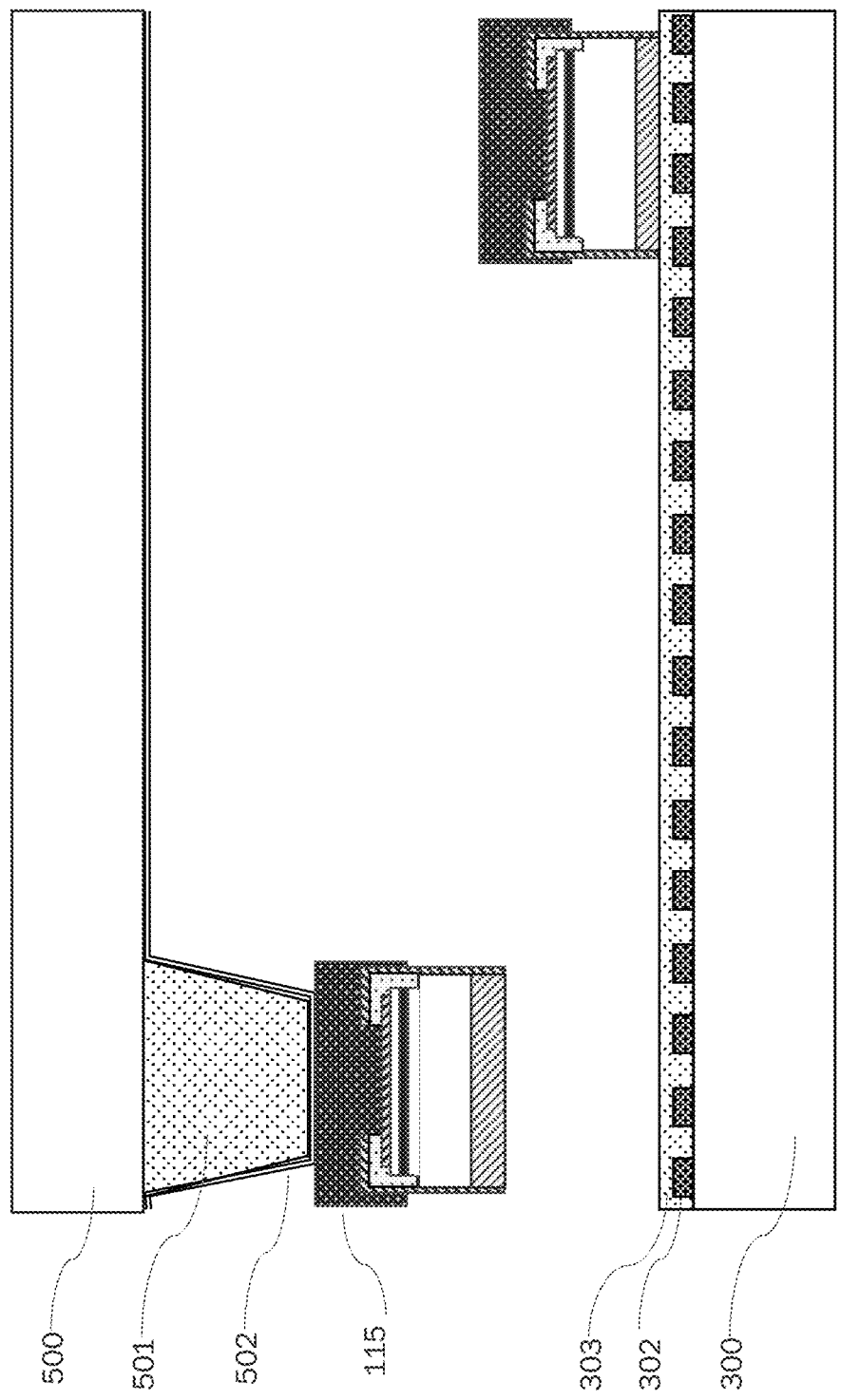
FIG. 11C illustrates the third step of a replacement process for the embodiment of FIGS. 11A and 11B.

The replacement process is very similar to the transfer process. The replacing pickup substrate is lowered to make contact to the defective micro-LED as shown in FIG. 11B. Then, a voltage is applied to the replacing pickup pedestal to generate electrostatic force. The voltage on the temporary receiving substrate is momentarily turned off to remove its electrostatic force. The replacing pickup substrate is lifted along with the defective micro-LED as shown in FIG. 11C.

Figure 12A:
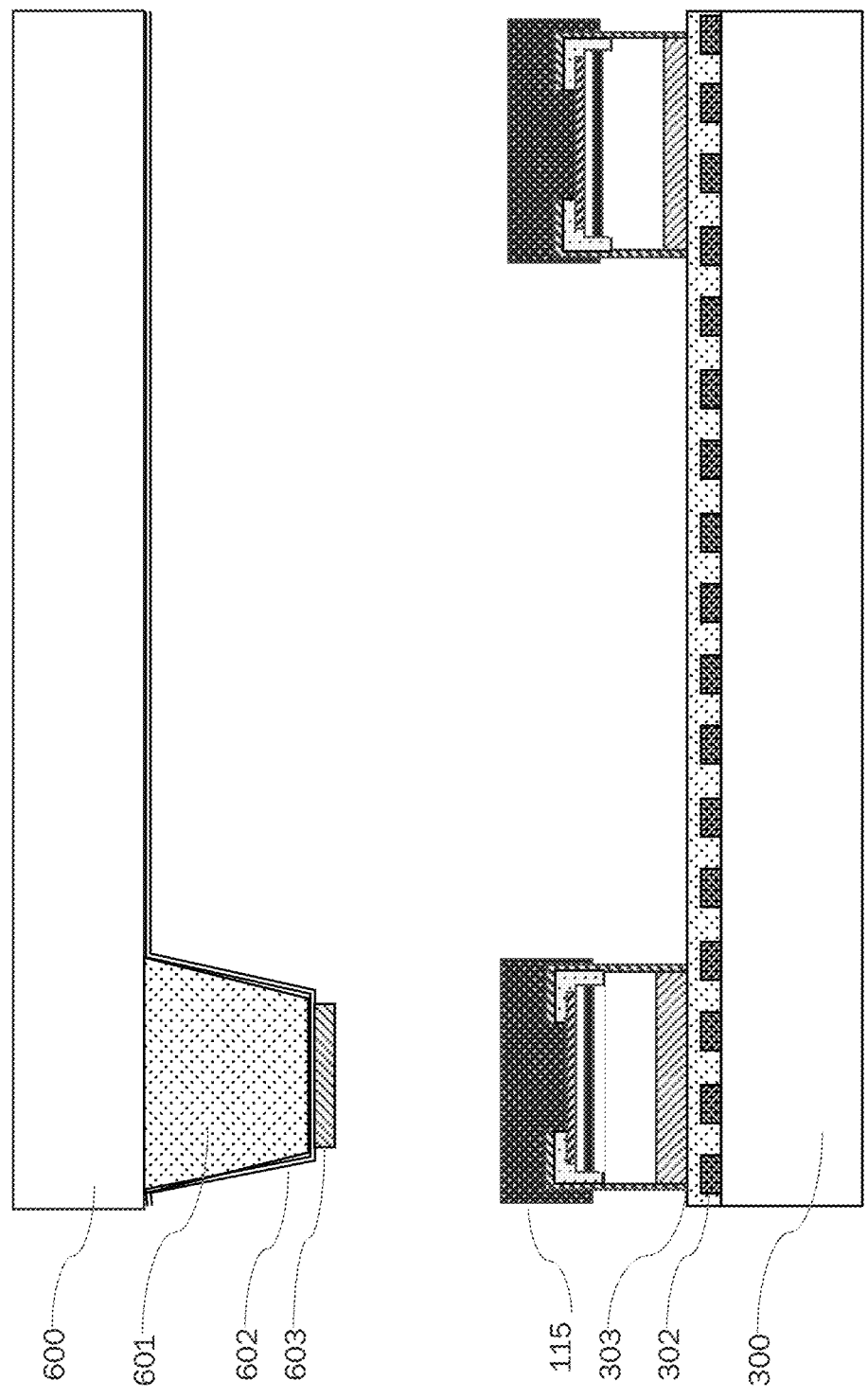
FIG. 12A illustrates the first step of a replacement process for a defective micro-LED according to another embodiment.
Figure 12B:
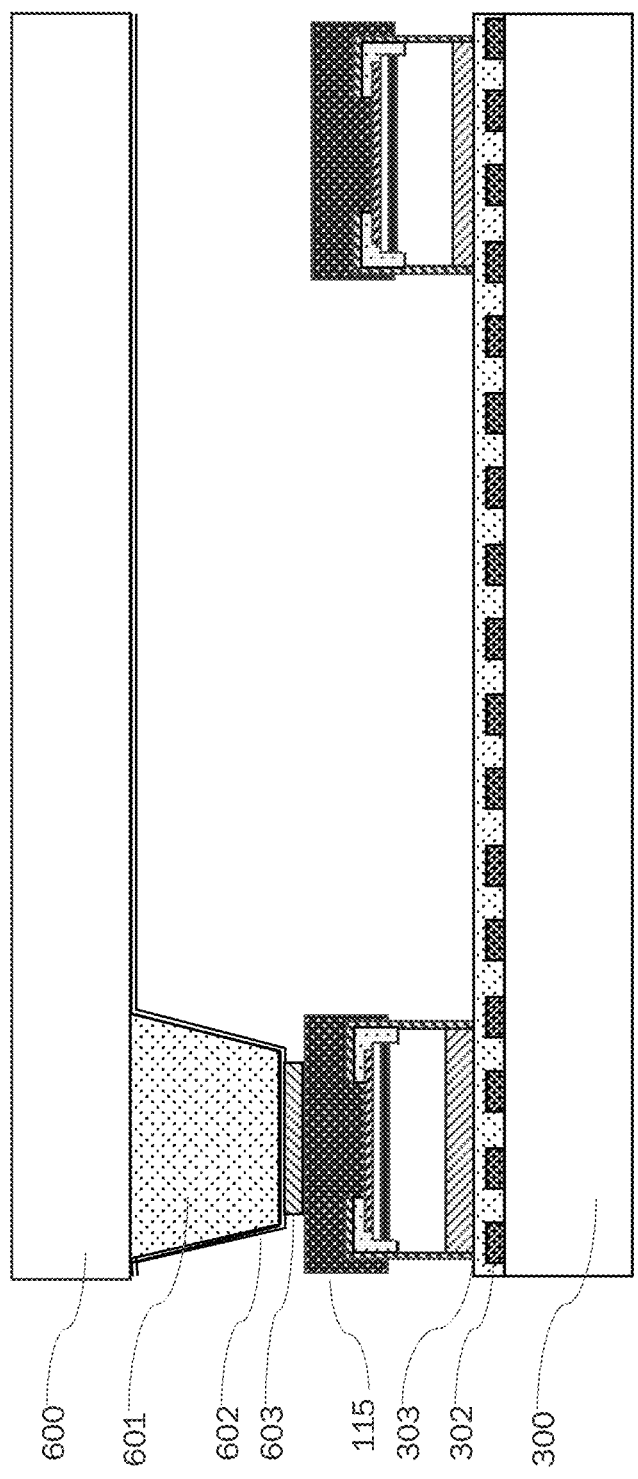
FIG. 12B illustrates the second step of a replacement process for the embodiment of FIG. 12A.
Figure 12C:
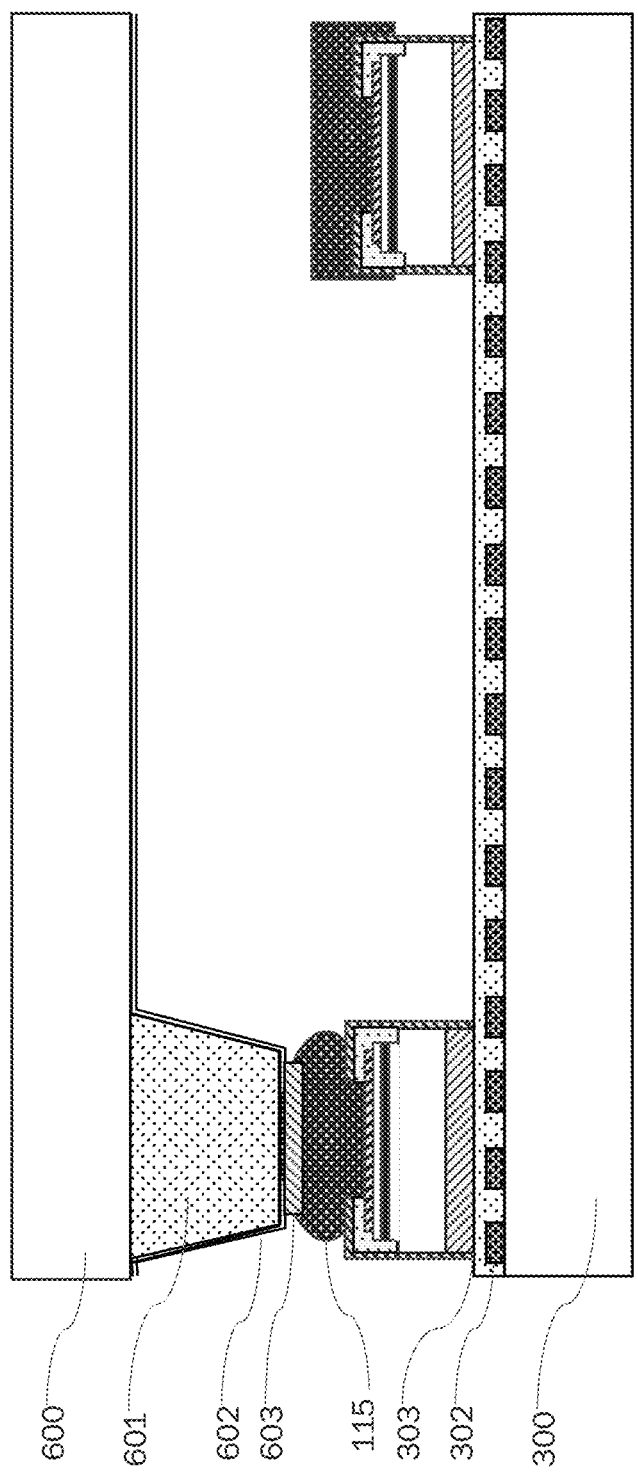
FIG. 12C illustrates the third step of a replacement process for the embodiment of FIGS. 12A and 12B.
Figure 12D:
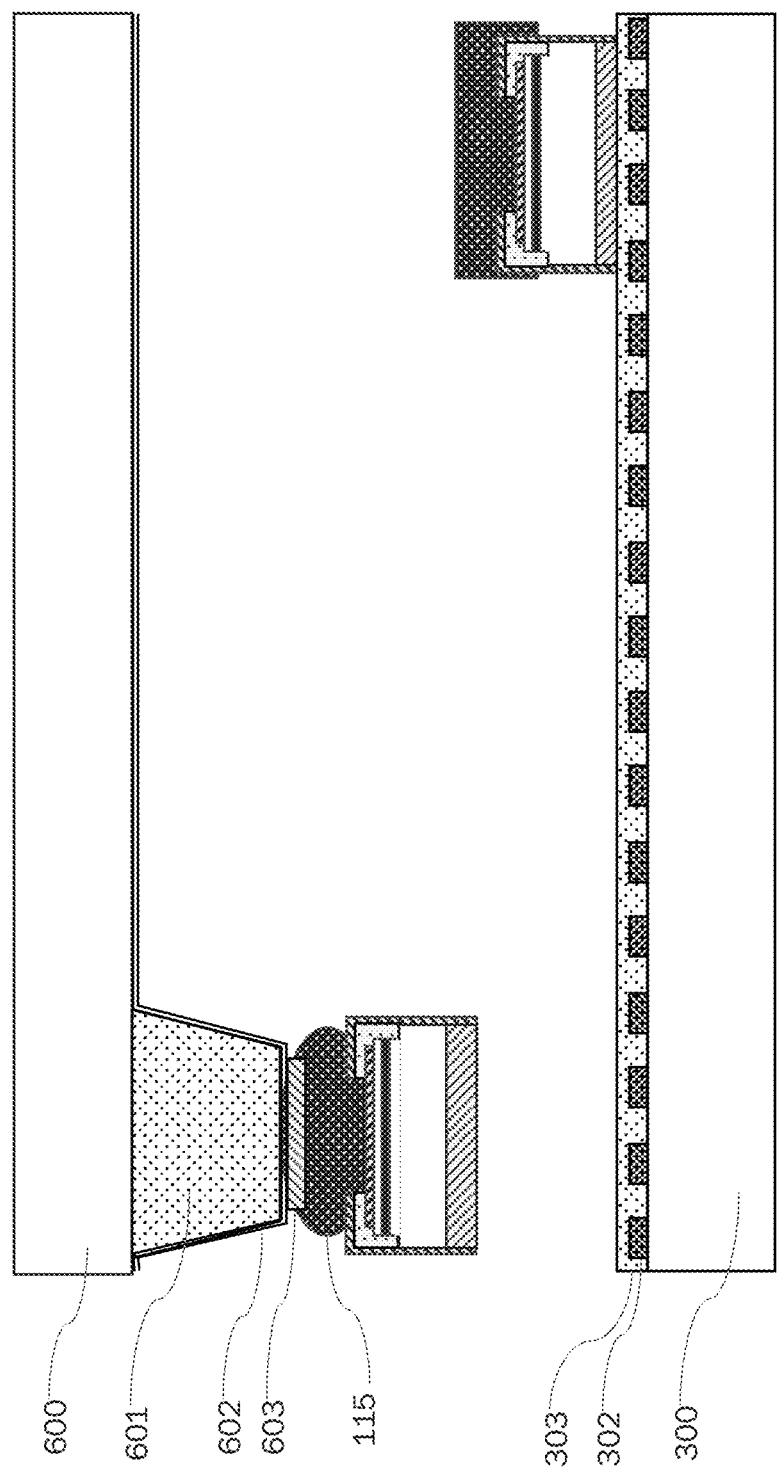
FIG. 12D illustrates the fourth step of a replacement process for the embodiment of FIGS. 12A, 12B and 12C.

An alternative replacing pickup substrate 600 is shown in FIG. 12A in which a metal pad 603 is deposited on the dielectric layer 602 on top of the pedestal 601. After making contact to the defective micro-LED as shown in FIG. 12B, the pickup pedestal is heated up to above the melting point of the bonding material on top of micro-LED. The heating can be done either by electrical current or optical beam. The bonding material 115 of the defective micro-LED melts to wet to the metal pad 603 as shown in FIG. 12C. When lowering the temperature of the pedestal of the substrate 600, the bonding material solidifies. The defective micro-LED is removed from the temporary receiving substrate when the replacing pickup substrate is lifted.

The advantage of using bonding material as pickup method for replacement is that it can be done more quickly. The replacing substrate can be just a metal probe. But, using one metal probe for one micro-LED might be too expensive. The metal probe can be made of Si MEMS process by which millions of metal probes can be made on one substrate which essentially look like what is depicted in FIG. 12A.

Once the defective micro-LED is removed from the temporary receiving substrate, a reverse process in FIG. 11 can be used to insert a working micro-LED to the vacant position.

The alignment of these transfers will create position variations. However, the issue is addressed by this self-aligned process depicted previously in FIG. 10E.

Now, referring back to FIG. 10E which only shows micro-LEDs after the first transfer and/or after replacement of defective micro-LEDs to the receiving substrate. In fact, for color displays, at least 3 colors of micro-LEDs are needed. With the bonding metal to accommodate as the vertical and horizontal tolerance, all transfers can be done to move micro-LEDs to their destined positions in sequence. Furthermore, at the last transfer, the receiving substrate will be pressed against a flat surface to squeeze bonding metal before cooling down. This final process will bring the bottom surfaces of all micro-LEDs and other devices to the same height, regardless their original layer thicknesses.

Figure 10F:
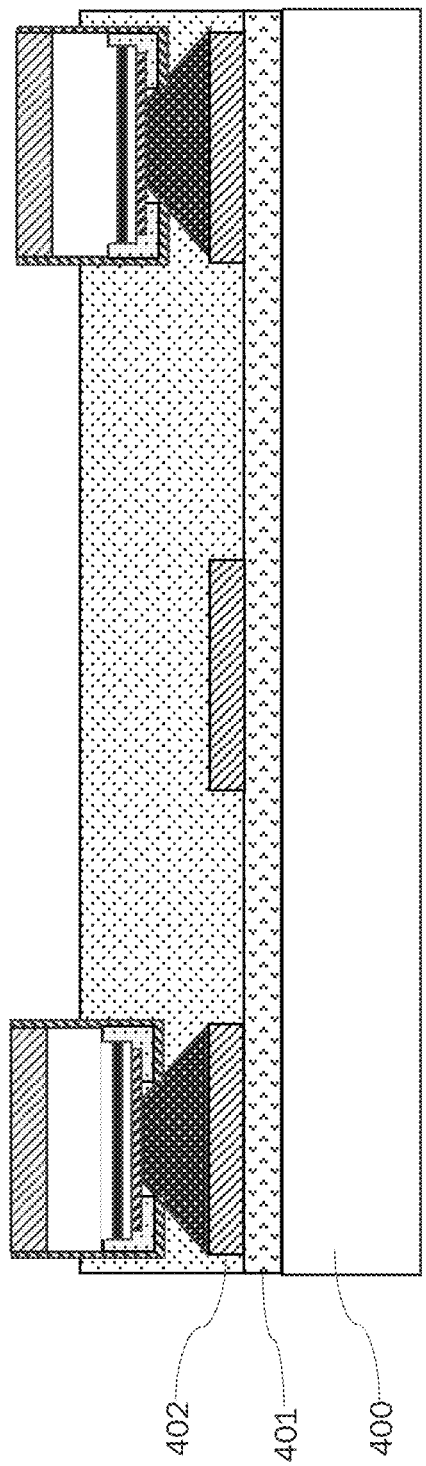
FIG. 10F illustrates the third step of a transfer to a temporary receiving substrate for the embodiment of FIGS. 10A through 10E.
Figure 10G:
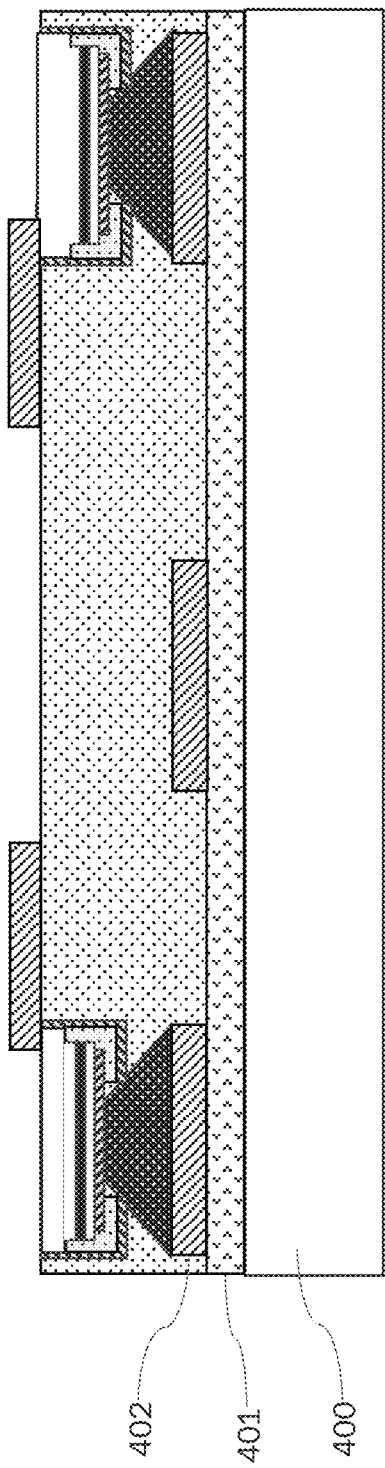
FIG. 10G illustrates the third step of a transfer to a temporary receiving substrate for the embodiment of FIGS. 10A through 10F.

After the micro-LEDs are attached and fixed on the receiving substrate, a planarization process, such as BCB or molding compound, is used to fill the empty spaces between transferred devices as shown in FIG. 10F. It might be beneficial to have materials which is light absorbing to fill the spaces between micro-LEDs to avoid color bleach effects. After etching or polishing away the buffer layer or etch stop layer, the interconnect metal is deposited to contact the n-layer of the micro-LEDs. The interconnect metal will be connected to the driver circuit which will provide proper current to turn on the micro-LEDs.

In some embodiments, a receiving substrate, after undergoing the processes described above, will become the desired final display product. In other embodiments, particularly where very large displays are desired, it may be preferable to place micro-LEDs on multiple relatively small receiving substrates, making the necessary contacts to those individual devices, and then "tile" the substrates together into one assembly at the final installation site, In conclusion, embodiments of the present invention allow for precise and reliable transfer of very small parts, such as micro-LEDs, from the substrate on which they are formed to destination boards or substrates, by disclosing detailed structural designs and associated fabrication methods for arrays of such parts, facilitating such transfer. Benefits include compatibility with conventional semiconductor manufacturing processes, enabling integrated, very cost-effective production.

The invention claimed is:
1. An array comprising:
a substrate; and
a plurality of micro-devices;
wherein each micro-device is suspended over a cavity in the substrate by at least one lateral hinge attached to a side post formed into the substrate; and
wherein each micro-device comprises:
a bonding layer;
a metal contact;
semiconductor device layers; and
a buffer layer.

2. The array of claim 1,
wherein the semiconductor device layers comprise GaN-based LED layers;
wherein the buffer layer comprises AlGaN; and
wherein the substrate comprises (111) oriented Silicon.

3. The array of claim 1,
wherein the semiconductor device layers comprise InGaAsP-based LED layers;
wherein the buffer layer comprises InGaP; and
wherein the substrate comprises GaAs.

4. The array of claim 1,
wherein the semiconductor device layers comprise CMOS layers;
wherein the buffer layer comprises SiO2; and
wherein the substrate comprises (100) oriented Silicon.

5. The array of claim 1,
wherein the side posts are positioned between adjacent micro-devices.

6. The array of claim 1,
wherein the cross-section shape of each side post is one of round, square and rectangular.

7. The array of claim 1,
wherein one of the side posts is shaped as a long wall positioned between two rows of micro-devices.

8. The array of claim 1,
wherein side posts of different cross-section shapes are present in the array.

9. The array of claim 1,
wherein the bonding layer consists of either one metal or a metal stack; and
wherein the bonding layer has a melting temperature below 500 C.

10. The array of claim 1,
wherein the bonding layer is configured to form solder balls after melting.

11. The array of claim 1,
wherein each lateral hinge is configured to be broken if and when a micro-device attached to that hinge is forcibly pushed towards the substrate.

12. The array of claim 1,
wherein the substrate is an epitaxial substrate.

13. The array of claim 2,
wherein the metal contact is optically reflective, with a reflectivity greater than 70%.

14. The array of claim 3,
wherein the metal contact is optically reflective, with a reflectivity greater than 70%.

* * * * *